(12) United States Patent
Kim

(10) Patent No.: US 12,243,785 B2
(45) Date of Patent: Mar. 4, 2025

(54) SEMICONDUCTOR DEVICE HAVING WORK-FUNCTION METAL AND METHOD OF FORMING THE SAME

(71) Applicant: Samsung Electronics Co., Ltd., Suwon-si (KR)

(72) Inventor: Juyoun Kim, Hwasung-si (KR)

(73) Assignee: Samsung Electronics Co., Ltd., Gyeonggi-do (KR)

(*) Notice: Subject to any disclaimer, the term of this patent is extended or adjusted under 35 U.S.C. 154(b) by 0 days.

(21) Appl. No.: 18/425,390

(22) Filed: Jan. 29, 2024

(65) Prior Publication Data
US 2024/0170340 A1    May 23, 2024

Related U.S. Application Data

(60) Continuation of application No. 17/958,805, filed on Oct. 3, 2022, now Pat. No. 11,929,289, which is a
(Continued)

(30) Foreign Application Priority Data
Jan. 29, 2015 (KR) .................. 10-2015-0014418

(51) Int. Cl.
*H01L 21/8238* (2006.01)
*H01L 21/28* (2006.01)
(Continued)

(52) U.S. Cl.
CPC .......... *H01L 21/823821* (2013.01); *H01L 21/28088* (2013.01); *H01L 21/823814* (2013.01);
(Continued)

(58) Field of Classification Search
None
See application file for complete search history.

(56) References Cited

U.S. PATENT DOCUMENTS 5,448,090 A    9/1995    Geissler et al.
6,800,512 B1   10/2004   Itonaga et al.
(Continued)

FOREIGN PATENT DOCUMENTS

CN    1767156 A    5/2006
CN    101188212 A   5/2008
(Continued)

OTHER PUBLICATIONS

Office Action for corresponding Chinese Application No. 201610019041.4 dated Dec. 13, 2018.
(Continued)

*Primary Examiner* — Xiaoming Liu
(74) *Attorney, Agent, or Firm* — HARNESS, DICKEY & PIERCE, P.L.C.

(57) ABSTRACT

In a semiconductor device, a first active area, a second active area, and a third active area are formed on a substrate. A first gate electrode is formed on the first active area, a second gate electrode is formed on the second active area, and a third gate electrode is formed on the third active area. The first gate electrode has a first P-work-function metal layer, a first capping layer, a first N-work-function metal layer, a first barrier metal layer, and a first conductive layer. The second gate electrode has a second capping layer, a second N-work-function metal layer, a second barrier metal layer, and a second conductive layer. The third gate electrode has a second P-work-function metal layer, a third capping layer, a third N-work-function metal layer, and a third barrier metal layer. The third gate electrode does not have the first and second conductive layers.

20 Claims, 19 Drawing Sheets

Related U.S. Application Data continuation of application No. 17/335,174, filed on Jun. 1, 2021, now Pat. No. 11,462,442, which is a continuation of application No. 16/921,037, filed on Jul. 6, 2020, now Pat. No. 11,043,430, which is a continuation of application No. 16/459,889, filed on Jul. 2, 2019, now Pat. No. 10,734,288, which is a continuation of application No. 15/468,631, filed on Mar. 24, 2017, now Pat. No. 10,388,574, which is a division of application No. 14/972,704, filed on Dec. 17, 2015, now Pat. No. 9,627,500.

(51) Int. Cl.
*H01L 21/84* (2006.01)
*H01L 27/088* (2006.01)
*H01L 27/092* (2006.01)
*H01L 27/12* (2006.01)
*H01L 29/49* (2006.01)
*H01L 29/51* (2006.01)
*H01L 29/66* (2006.01)

(52) U.S. Cl.
CPC .... *H01L 21/823842* (2013.01); *H01L 21/845* (2013.01); *H01L 27/088* (2013.01); *H01L 27/092* (2013.01); *H01L 27/0924* (2013.01); *H01L 27/1211* (2013.01); *H01L 29/4966* (2013.01); *H01L 29/513* (2013.01); *H01L 29/517* (2013.01); *H01L 29/66545* (2013.01)

(56) References Cited

U.S. PATENT DOCUMENTS

| | | | |
|---|---|---|---|
| 7,265,042 B2 | 9/2007 | Nam | |
| 7,699,926 B2 | 4/2010 | Huang | |
| 7,700,926 B2 | 4/2010 | Tartaglia et al. | |
| 7,701,131 B2 | 4/2010 | Gerhard et al. | |
| 7,704,918 B2 | 4/2010 | Adzic et al. | |
| 7,713,431 B2 | 5/2010 | Ukei et al. | |
| 7,723,636 B2 | 5/2010 | Ochiai et al. | |
| 7,726,246 B2 | 6/2010 | Williams | |
| 7,727,592 B2 | 6/2010 | Cedergren et al. | |
| 7,731,862 B2 | 6/2010 | Nakagawa et al. | |
| 7,732,874 B2 | 6/2010 | Zhu et al. | |
| 7,740,682 B2 | 6/2010 | Ragan et al. | |
| 7,757,778 B2 | 7/2010 | Calderwood | |
| 7,759,173 B2 | 7/2010 | DeVries et al. | |
| 7,767,330 B2 | 8/2010 | Merzougui et al. | |
| 7,767,777 B2 | 8/2010 | Buesing et al. | |
| 7,768,052 B1 | 8/2010 | Carns et al. | |
| 7,770,664 B2 | 8/2010 | Laird et al. | |
| 7,771,117 B2 | 8/2010 | Kim et al. | |
| 7,776,622 B2 | 8/2010 | Nagai | |
| 7,776,765 B2 | 8/2010 | Forbes et al. | |
| 7,781,352 B2 | 8/2010 | Fukazawa et al. | |
| 7,791,005 B2 | 9/2010 | Mize et al. | |
| 7,791,784 B2 | 9/2010 | Giron et al. | |
| 7,794,651 B2 | 9/2010 | Beguinot et al. | |
| 7,795,097 B2 | 9/2010 | Pas | |
| 7,795,792 B2 | 9/2010 | Arnold et al. | |
| 7,799,678 B2 | 9/2010 | Kropewnicki et al. | |
| 7,809,115 B2 | 10/2010 | Allen et al. | |
| 7,812,320 B2 | 10/2010 | Yun et al. | |
| 7,814,997 B2 | 10/2010 | Aliko et al. | |
| 7,820,305 B2 | 10/2010 | Schulte et al. | |
| 7,828,993 B2 | 11/2010 | Roth et al. | |
| 7,829,449 B2 | 11/2010 | Regnier et al. | |
| 7,836,615 B2 | 11/2010 | Winter | |
| 7,838,356 B2 | 11/2010 | Kirkpatrick et al. | |
| 7,838,912 B2 | 11/2010 | Niwa et al. | |
| 7,839,138 B2 | 11/2010 | Garcia | |
| 7,851,692 B2 | 12/2010 | Sakurada et al. | |
| 7,851,988 B2 | 12/2010 | Braune et al. | |
| 7,862,126 B2 | 1/2011 | Hall et al. | |
| 7,862,902 B2 | 1/2011 | Zidar | |
| 7,862,904 B2 | 1/2011 | Vestweber et al. | |
| 7,867,790 B2 | 1/2011 | Yoo et al. | |
| 7,871,508 B2 | 1/2011 | Carson et al. | |
| 7,875,156 B2 | 1/2011 | Gunji et al. | |
| 7,875,927 B2 | 1/2011 | Inoue | |
| 7,879,221 B2 | 2/2011 | Putter et al. | |
| 7,879,475 B2 | 2/2011 | Toyoda et al. | |
| 7,882,639 B2 | 2/2011 | Powers | |
| 7,888,800 B2 | 2/2011 | Landis | |
| 7,892,962 B2 | 2/2011 | Su | |
| 7,897,939 B2 | 3/2011 | Chandler et al. | |
| 7,899,571 B2 | 3/2011 | Basim et al. | |
| 7,900,861 B2 | 3/2011 | Sharp | |
| 7,913,806 B2 | 3/2011 | Pabon et al. | |
| 7,914,904 B2 | 3/2011 | Morra et al. | |
| 7,918,298 B2 | 4/2011 | Cook | |
| 7,922,604 B2 | 4/2011 | Roach et al. | |
| 7,923,838 B2 | 4/2011 | Lavoie et al. | |
| 7,934,315 B2 | 5/2011 | Milleville | |
| 7,935,883 B2 | 5/2011 | Sakurada et al. | |
| 7,942,219 B2 | 5/2011 | Keshavan et al. | |
| 7,943,988 B2 | 5/2011 | Pham et al. | |
| 7,947,594 B2 | 5/2011 | Louis | |
| 7,955,919 B2 | 6/2011 | Pritchard et al. | |
| 7,956,017 B2 | 6/2011 | Gatlin et al. | |
| 7,959,409 B2 | 6/2011 | Guo et al. | |
| 7,965,031 B2 | 6/2011 | Brunner et al. | |
| 7,967,457 B2 | 6/2011 | Rabinowitz | |
| 7,975,785 B2 | 7/2011 | Drivdahl et al. | |
| 7,981,522 B2 | 7/2011 | Vestweber et al. | |
| 7,982,315 B2 | 7/2011 | Chen et al. | |
| 8,003,227 B2 | 8/2011 | Vestweber et al. | |
| 8,006,785 B2 | 8/2011 | Oldham et al. | |
| 8,012,771 B2 | 9/2011 | Pullini et al. | |
| 8,013,368 B2 | 9/2011 | Bohr | |
| 8,017,475 B1 | 9/2011 | Carns et al. | |
| 8,022,116 B2 | 9/2011 | Coppens et al. | |
| 8,030,644 B2 | 10/2011 | Shin et al. | |
| 8,034,846 B2 | 10/2011 | Koyama et al. | |
| 8,039,388 B1 | 10/2011 | Ng et al. | |
| 8,057,571 B2 | 11/2011 | Pauty et al. | |
| 8,059,057 B2 | 11/2011 | Mason et al. | |
| 8,062,966 B2 | 11/2011 | Mehrad et al. | |
| 8,080,505 B2 | 12/2011 | Ernur et al. | |
| 8,083,519 B2 | 12/2011 | Douglas | |
| 8,084,370 B2 | 12/2011 | Forbes et al. | |
| 8,093,117 B2 | 1/2012 | Tsau et al. | |
| 8,093,120 B2 | 1/2012 | Yeh et al. | |
| 8,097,207 B2 | 1/2012 | Beguinot et al. | |
| 8,101,485 B2 | 1/2012 | Bohr | |
| 8,105,086 B2 | 1/2012 | Asgary | |
| 8,129,795 B2 | 3/2012 | Datta et al. | |
| 8,138,533 B2 | 3/2012 | Koike et al. | |
| 8,148,227 B2 | 4/2012 | Helneder | |
| 8,162,515 B2 | 4/2012 | Graham | |
| RE43,387 E | 5/2012 | Leverenz et al. | |
| 8,168,009 B2 | 5/2012 | Mesquita et al. | |
| 8,168,056 B2 | 5/2012 | Datta et al. | |
| 8,168,468 B2 | 5/2012 | Mathew et al. | |
| 8,176,849 B1 | 5/2012 | Gold et al. | |
| 8,178,439 B2 | 5/2012 | Tohnoe et al. | |
| 8,178,477 B2 | 5/2012 | Skala et al. | |
| 8,183,305 B2 | 5/2012 | Neffgen et al. | |
| 8,183,644 B1 | 5/2012 | Chuang et al. | |
| 8,192,256 B2 | 6/2012 | Andrews et al. | |
| 8,193,430 B2 | 6/2012 | Papadimitrakopoulos et al. | |
| 8,196,719 B2 | 6/2012 | Mayrhofer | |
| 8,197,547 B2 | 6/2012 | Higham et al. | |
| 8,198,151 B2 | 6/2012 | Lin et al. | |
| 8,202,627 B2 | 6/2012 | Reath et al. | |
| 8,225,890 B2 | 7/2012 | Scott | |
| 8,261,858 B1 | 9/2012 | Atkins et al. | |
| 8,273,626 B2 | 9/2012 | Hareland et al. | |
| 8,304,115 B1 | 11/2012 | Petkov et al. | |
| 8,304,840 B2 | 11/2012 | Teo et al. | |
| 8,309,410 B2 | 11/2012 | Pham et al. | |
| 8,314,494 B2 | 11/2012 | Nopper et al. | |

(56) References Cited

U.S. PATENT DOCUMENTS

| | | |
|---|---|---|
| 8,324,095 B2 | 12/2012 | Chung et al. |
| 8,337,604 B1 | 12/2012 | St. Amant et al. |
| 8,337,763 B1 | 12/2012 | St. Amant et al. |
| 8,342,486 B2 | 1/2013 | Smith |
| 8,343,867 B2 | 1/2013 | Ng et al. |
| 8,349,678 B2 | 1/2013 | Chuang et al. |
| 8,354,049 B2 | 1/2013 | Wakamura et al. |
| 8,372,263 B2 | 2/2013 | Hayasaka |
| 8,372,703 B2 | 2/2013 | Kirkpatrick et al. |
| 8,377,547 B2 | 2/2013 | Noguchi et al. |
| 8,397,840 B2 | 3/2013 | Downie et al. |
| 8,410,423 B2 | 4/2013 | Bartlett et al. |
| 8,410,699 B2 | 4/2013 | Yu |
| 8,415,186 B2 | 4/2013 | Cai et al. |
| 8,420,491 B2 | 4/2013 | Utomo et al. |
| 8,435,887 B2 | 5/2013 | Kelly et al. |
| 8,439,117 B2 | 5/2013 | Schultz et al. |
| 8,444,028 B2 | 5/2013 | Rasa et al. |
| 8,459,382 B2 | 6/2013 | Aliko et al. |
| 8,465,177 B2 | 6/2013 | Yu |
| 8,470,898 B2 | 6/2013 | Huang |
| 8,476,369 B2 | 7/2013 | Helling |
| 8,487,300 B2 | 7/2013 | Parham et al. |
| 8,497,535 B2 | 7/2013 | Lee et al. |
| 8,500,093 B2 | 8/2013 | Haines et al. |
| 8,501,032 B2 | 8/2013 | Grotjahn |
| 8,501,587 B2 | 8/2013 | Chen et al. |
| 8,518,368 B2 | 8/2013 | Abdur-Rashid et al. |
| 8,518,787 B2 | 8/2013 | Ding et al. |
| 8,536,040 B1 | 9/2013 | Park |
| 8,551,840 B2 | 10/2013 | Hwang |
| 8,557,632 B1 | 10/2013 | Or-Bach et al. |
| 8,562,761 B2 | 10/2013 | Gunnarsson et al. |
| 8,564,768 B2 | 10/2013 | Schroeder et al. |
| 8,569,129 B2 | 10/2013 | Ma et al. |
| 8,569,943 B2 | 10/2013 | Mitsuishi et al. |
| 8,578,511 B2 | 11/2013 | Liu et al. |
| 8,580,108 B2 | 11/2013 | Novak et al. |
| 8,595,861 B2 | 11/2013 | Liu et al. |
| 8,609,546 B2 | 12/2013 | Lee et al. |
| 8,617,723 B2 | 12/2013 | Stoessel |
| 8,624,327 B2 | 1/2014 | Hung et al. |
| 8,632,537 B2 | 1/2014 | McNall, III et al. |
| 8,637,359 B2 | 1/2014 | Chang et al. |
| 8,640,942 B1 | 2/2014 | Ozbaysal et al. |
| 8,642,403 B1 | 2/2014 | Cohen et al. |
| 8,646,311 B1 | 2/2014 | Moseley |
| 8,647,938 B1 | 2/2014 | Baars et al. |
| 8,647,972 B1 | 2/2014 | Ando et al. |
| 8,663,550 B2 | 3/2014 | Angles |
| 8,673,237 B2 | 3/2014 | Schalkhammer |
| 8,673,731 B2 | 3/2014 | Chang et al. |
| 8,680,306 B2 | 3/2014 | Chahen et al. |
| 8,680,307 B2 | 3/2014 | Chahen et al. |
| 8,690,971 B2 | 4/2014 | Hundley et al. |
| 8,691,400 B2 | 4/2014 | Stoessel et al. |
| 8,692,229 B2 | 4/2014 | Cohen et al. |
| 8,697,518 B2 | 4/2014 | Ji et al. |
| 8,704,134 B2 | 4/2014 | Branagan et al. |
| 8,704,280 B2 | 4/2014 | Xu |
| 8,706,198 B2 | 4/2014 | Mangiardi |
| 8,715,106 B1 | 5/2014 | Seluga et al. |
| 8,716,695 B2 | 5/2014 | Cohen et al. |
| 8,722,485 B1 | 5/2014 | Tong et al. |
| 8,722,491 B2 | 5/2014 | Park et al. |
| 8,722,500 B2 | 5/2014 | Scheiper et al. |
| 8,728,349 B2 | 5/2014 | Liu et al. |
| 8,729,470 B2 | 5/2014 | Adler |
| 8,741,771 B2 | 6/2014 | Gambino et al. |
| 8,759,172 B2 | 6/2014 | Li et al. |
| 8,765,546 B1 | 7/2014 | Hung et al. |
| 8,772,165 B2 | 7/2014 | Kim et al. |
| 8,776,719 B2 | 7/2014 | Radoiu et al. |
| 8,779,529 B2 | 7/2014 | Sen et al. |
| 8,784,766 B1 | 7/2014 | Uppireddi et al. |
| 8,789,625 B2 | 7/2014 | Mirchandani et al. |
| 8,796,084 B2 | 8/2014 | Tsai et al. |
| 8,796,128 B2 | 8/2014 | Edge et al. |
| 8,796,135 B2 | 8/2014 | Oganesian et al. |
| 8,806,785 B2 | 8/2014 | Brufau Guinovart et al. |
| 8,814,968 B2 | 8/2014 | Jiang et al. |
| 8,828,144 B2 | 9/2014 | Kumon et al. |
| 8,846,464 B1 | 9/2014 | Liu et al. |
| 8,846,922 B2 | 9/2014 | Hoge et al. |
| 8,852,451 B2 | 10/2014 | Shimada et al. |
| 8,859,800 B2 | 10/2014 | Ignatyev et al. |
| 8,865,321 B2 | 10/2014 | Stoessel et al. |
| 8,865,595 B2 | 10/2014 | Chang |
| 8,871,877 B2 | 10/2014 | Thieuleux et al. |
| 8,875,814 B2 | 11/2014 | Atkins et al. |
| 8,969,878 B2 | 3/2015 | Kim |
| 9,219,124 B2 | 12/2015 | Chuang et al. |
| 9,230,795 B1 | 1/2016 | Wang et al. |
| 9,240,453 B2 | 1/2016 | Oh |
| 9,627,500 B2 | 4/2017 | Kim |
| 10,388,574 B2 | 8/2019 | Kim |
| 10,734,288 B2 | 8/2020 | Kim |
| 11,043,430 B2 | 6/2021 | Kim |
| 11,462,442 B2 | 10/2022 | Kim |
| 2002/0138813 A1 | 9/2002 | Teh et al. |
| 2003/0087499 A1 | 5/2003 | Lane et al. |
| 2005/0224800 A1 | 10/2005 | Lindert et al. |
| 2005/0239242 A1 | 10/2005 | Zhu et al. |
| 2006/0138463 A1 | 6/2006 | Kim et al. |
| 2006/0214212 A1 | 9/2006 | Horita et al. |
| 2008/0113480 A1 | 5/2008 | Nishida et al. |
| 2008/0157212 A1 | 7/2008 | Lavoie et al. |
| 2008/0224235 A1 | 9/2008 | Lavoie et al. |
| 2008/0315281 A1 | 12/2008 | Park |
| 2009/0218632 A1 | 9/2009 | Cheng |
| 2012/0094475 A1 | 4/2012 | Tsau |
| 2012/0306026 A1 | 12/2012 | Guo et al. |
| 2012/0319179 A1 | 12/2012 | Huang et al. |
| 2013/0026578 A1 | 1/2013 | Tsau |
| 2013/0026579 A1 | 1/2013 | Lu et al. |
| 2013/0062701 A1 | 3/2013 | Lee et al. |
| 2013/0105919 A1 | 5/2013 | Jiang et al. |
| 2013/0126977 A1 | 5/2013 | Chuang et al. |
| 2013/0137256 A1 | 5/2013 | Tsai et al. |
| 2013/0149830 A1 | 6/2013 | Rhee et al. |
| 2013/0161754 A1 | 6/2013 | Su et al. |
| 2013/0249003 A1 | 9/2013 | Oh et al. |
| 2013/0277749 A1 | 10/2013 | Kura et al. |
| 2013/0277750 A1 | 10/2013 | Lai et al. |
| 2013/0299914 A1 | 11/2013 | Kim |
| 2013/0299918 A1 | 11/2013 | Kim et al. |
| 2014/0001543 A1 | 1/2014 | Kim et al. |
| 2014/0103441 A1 | 4/2014 | Kim et al. |
| 2014/0187010 A1 | 7/2014 | Lii |
| 2014/0239407 A1 | 8/2014 | Manabe et al. |
| 2014/0367761 A1 | 12/2014 | Park |
| 2014/0374840 A1 | 12/2014 | Lee et al. |
| 2015/0093864 A1 | 4/2015 | Perera |
| 2015/0187766 A1 | 7/2015 | Basker et al. |

FOREIGN PATENT DOCUMENTS

| | | |
|---|---|---|
| CN | 101546772 A | 9/2009 |
| CN | 102347330 A | 2/2012 |
| CN | 102903741 A | 1/2013 |
| CN | 102956556 A | 3/2013 |
| CN | 103426928 A | 12/2013 |
| CN | 103515425 A | 1/2014 |
| CN | 104241367 A | 12/2014 |
| KR | 2013-0079010 A | 7/2013 |
| KR | 2013-0127257 A | 11/2013 |
| KR | 2015-0000267 A | 1/2015 |

OTHER PUBLICATIONS

Office Action dated Mar. 23, 2020, issued in corresponding Chinese Patent Application No. 201710805103.9.

(56) References Cited

OTHER PUBLICATIONS

Office Action dated Oct. 25, 2020, issued in corresponding Korean Patent Application No. 2015-14418.
Office Action dated Apr. 26, 2022, issued in corresponding Chinese Patent Application No. 201810567463.4.
Notice of Allowance dated Dec. 27, 2023, issued in corresponding Chinese Patent Application No. 201810567463.4.

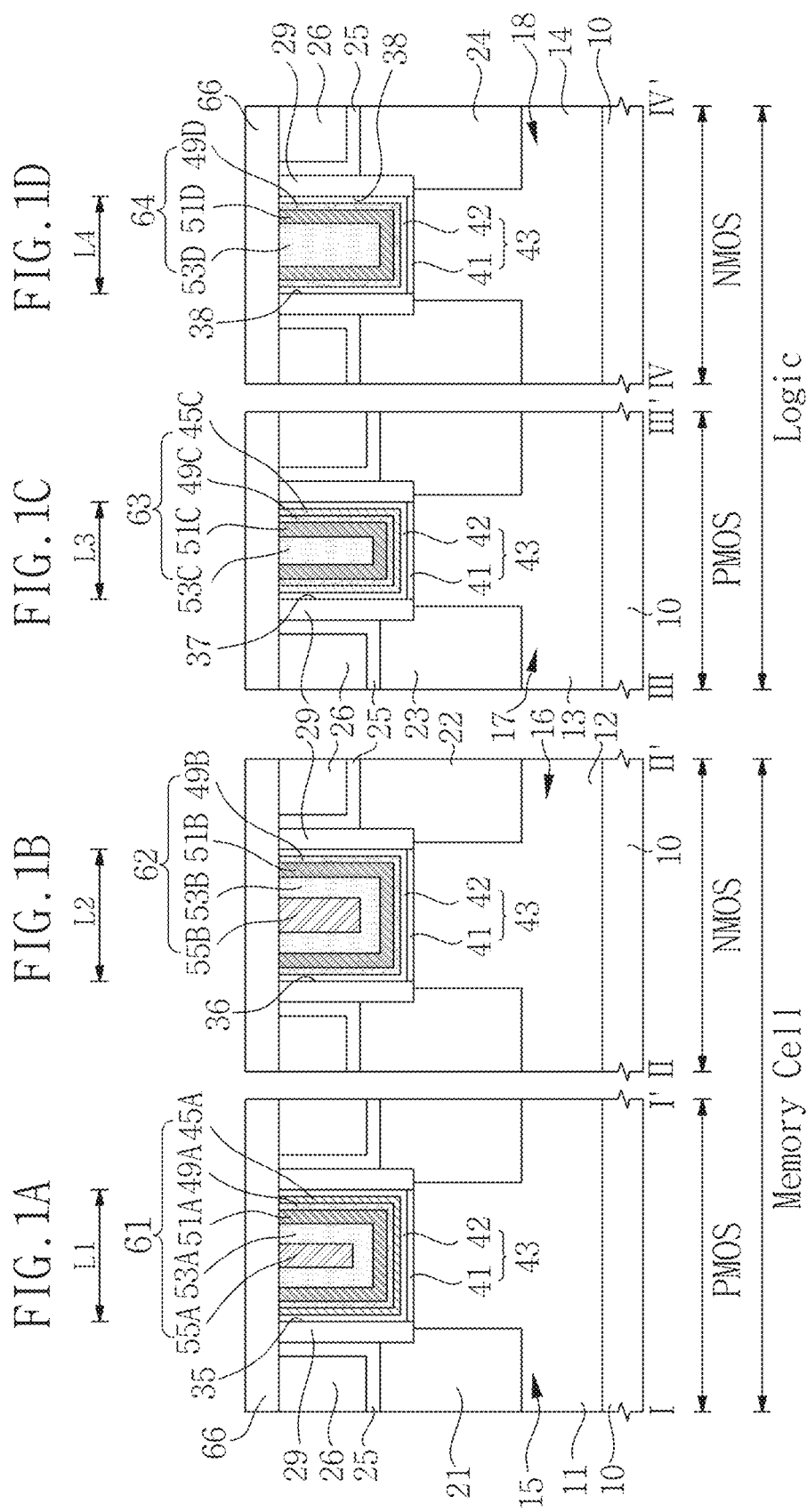

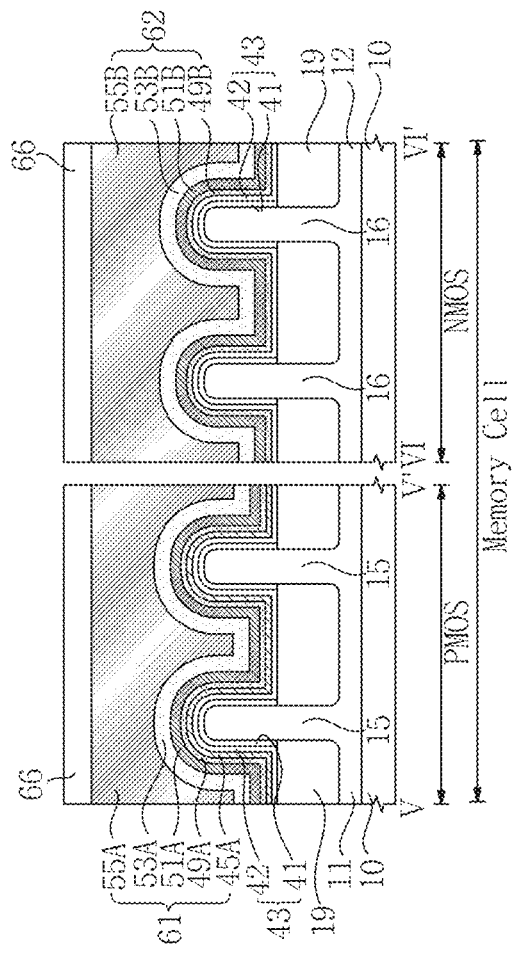
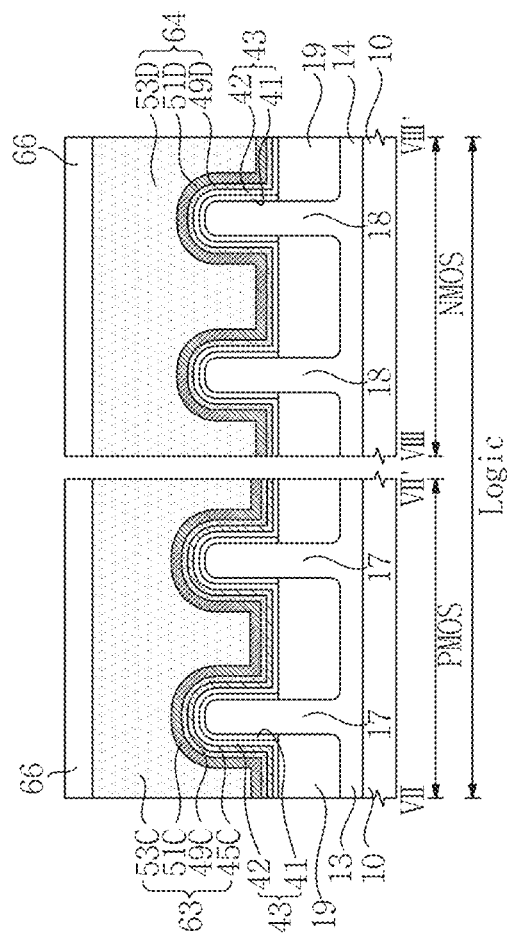

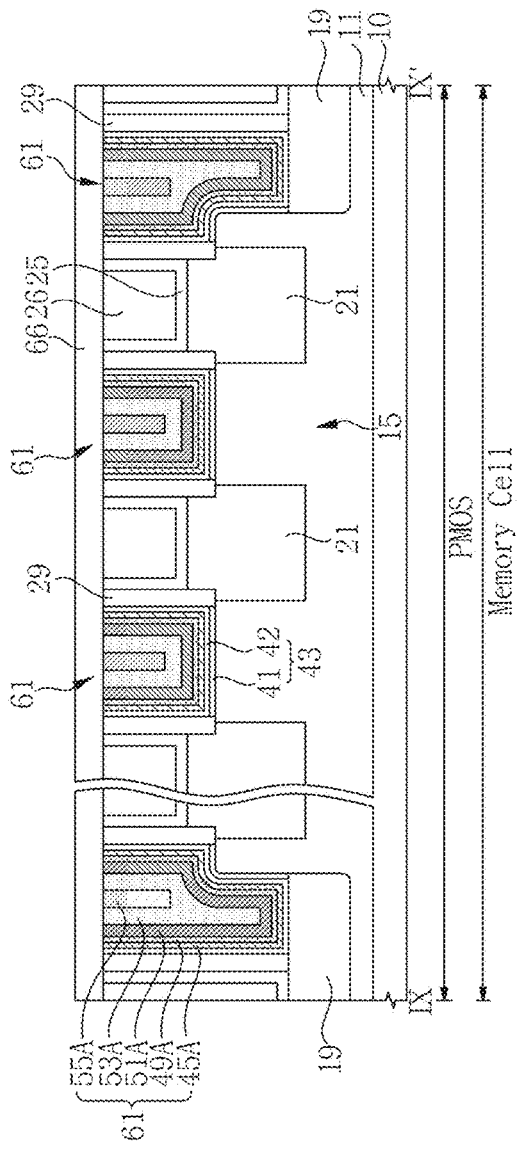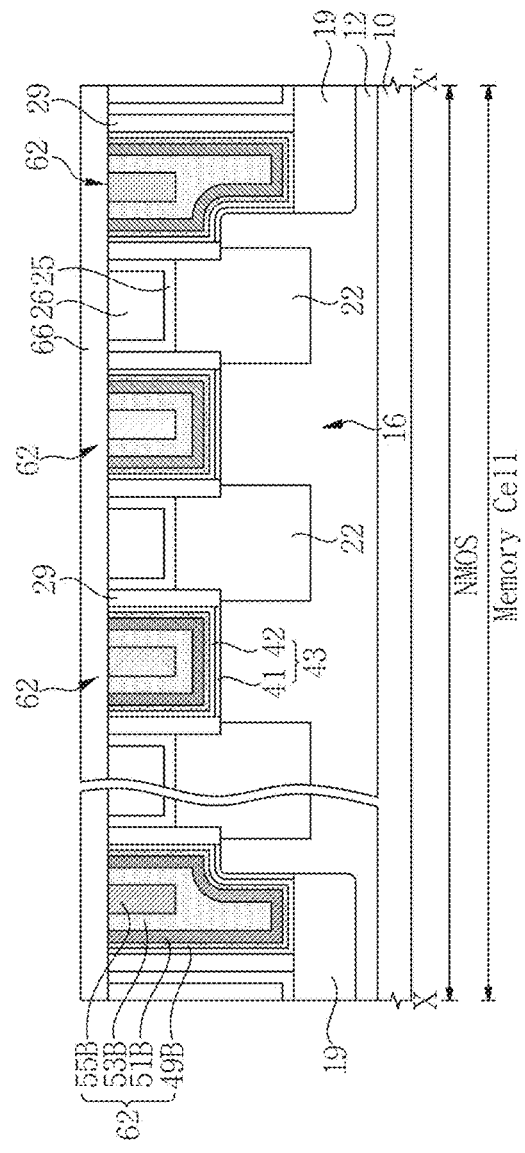

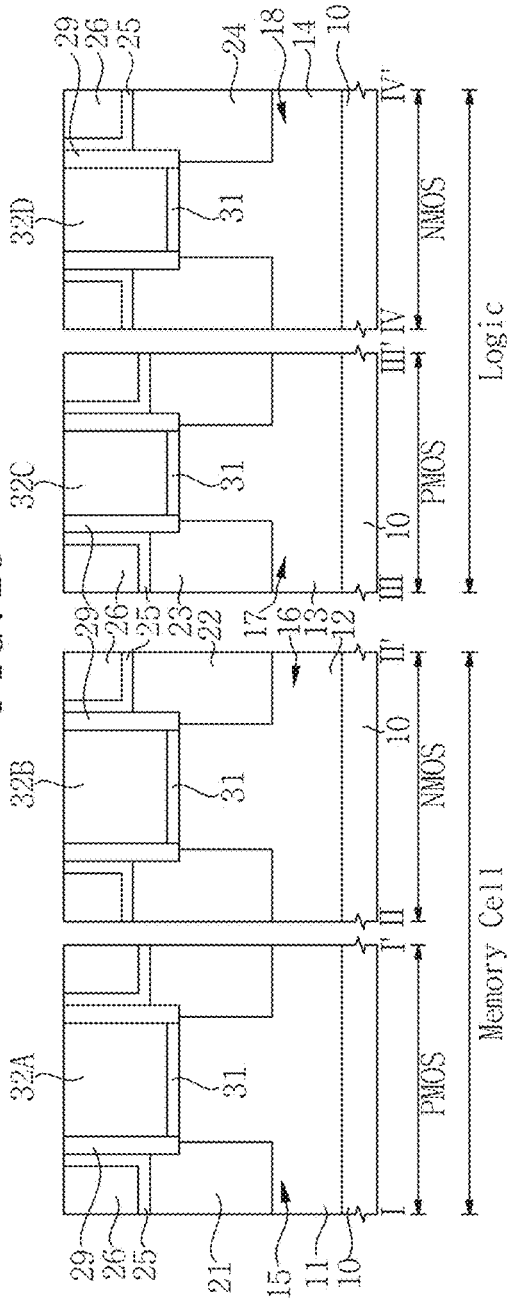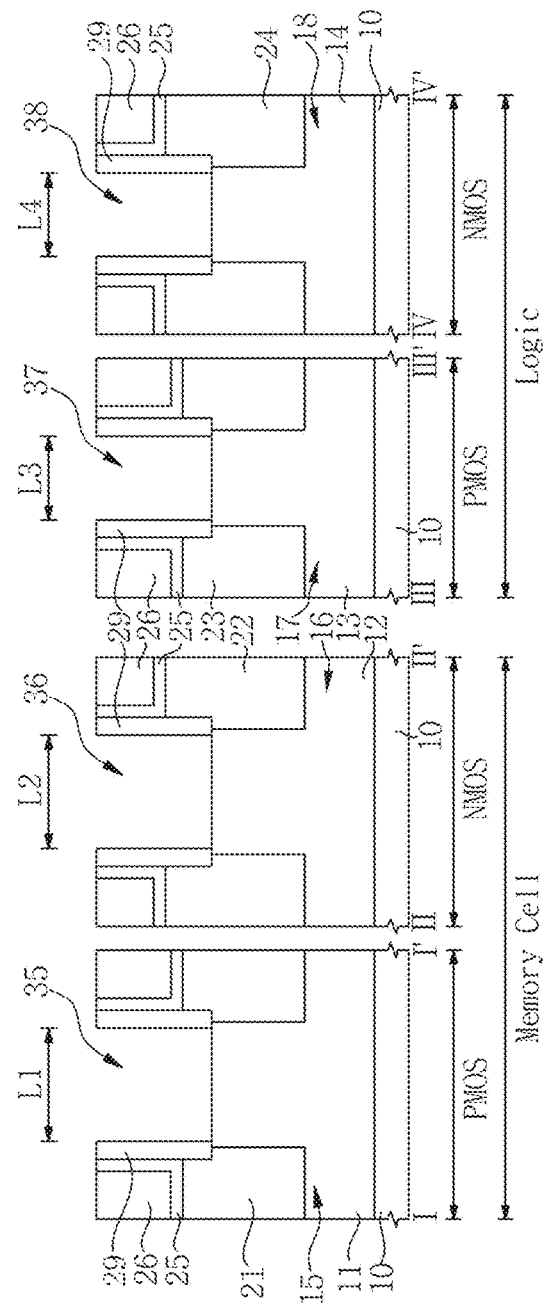

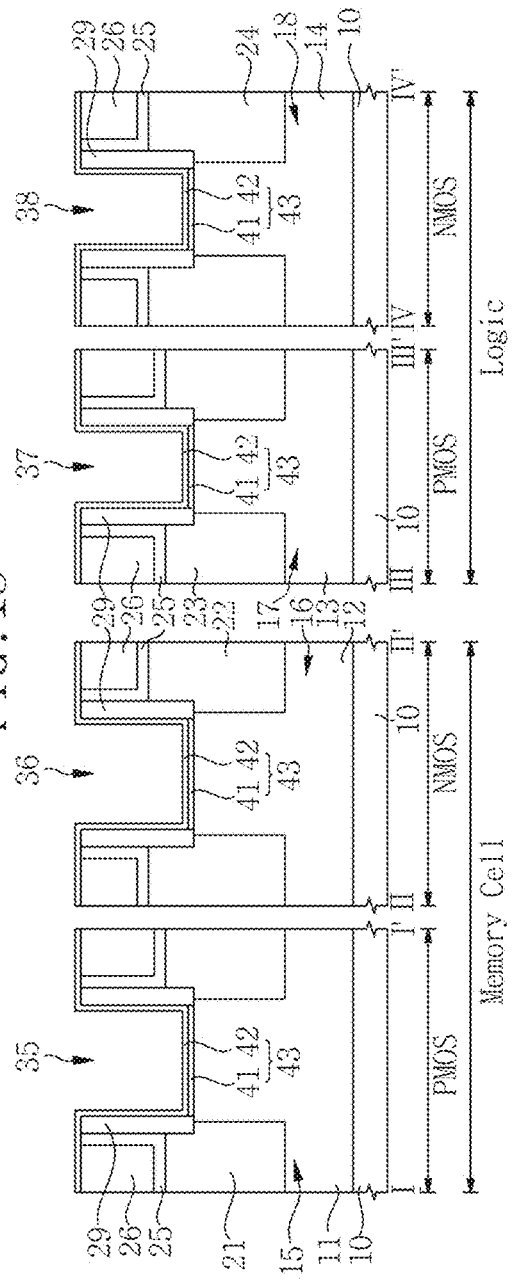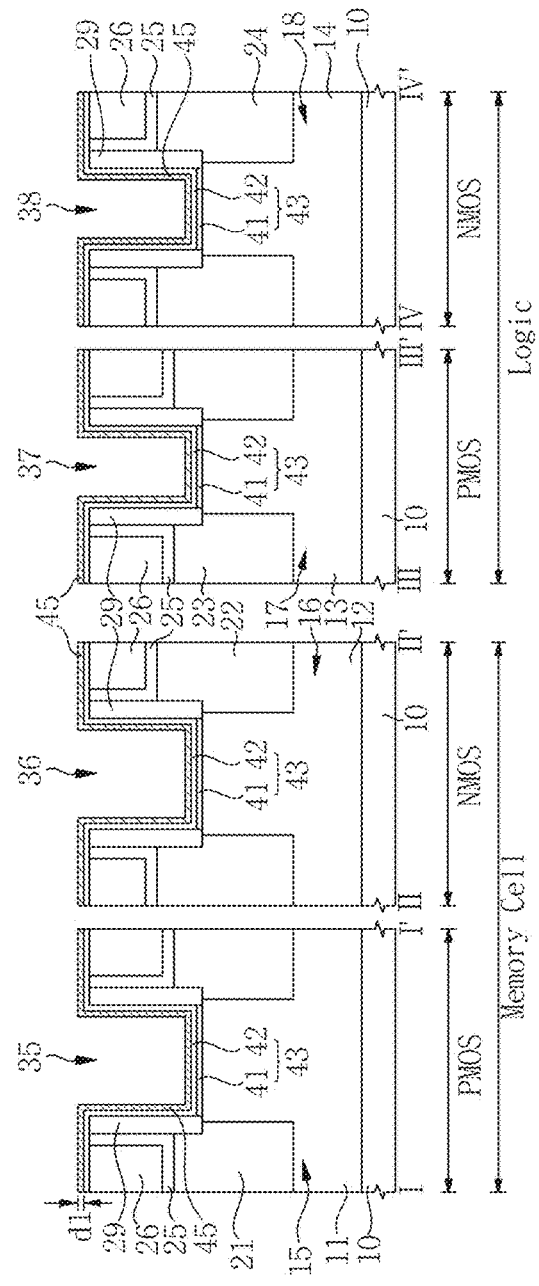

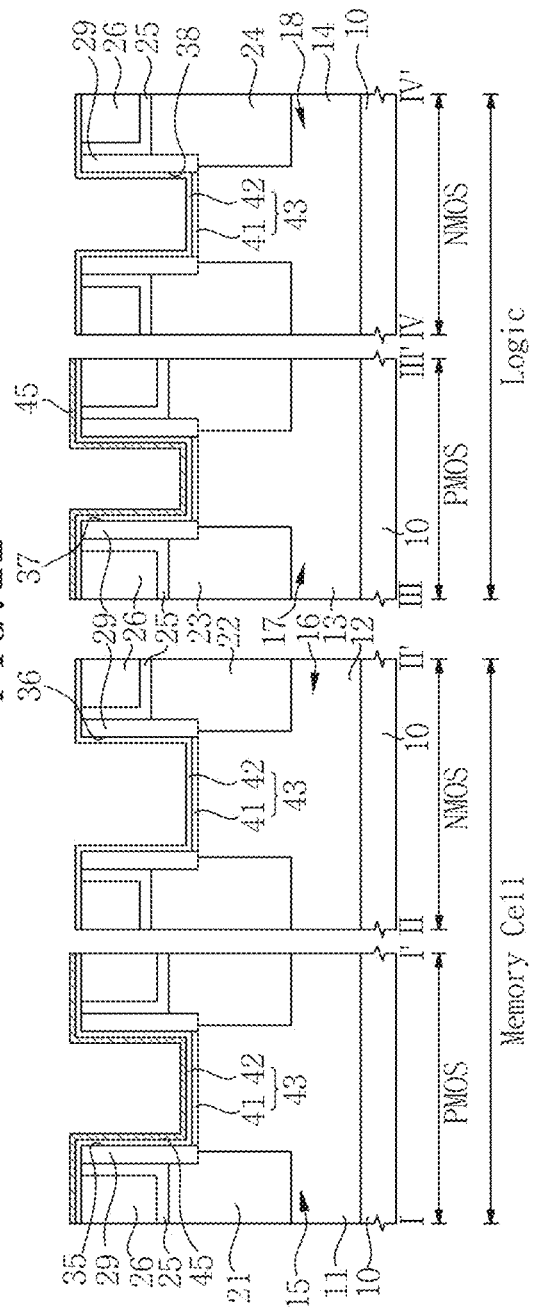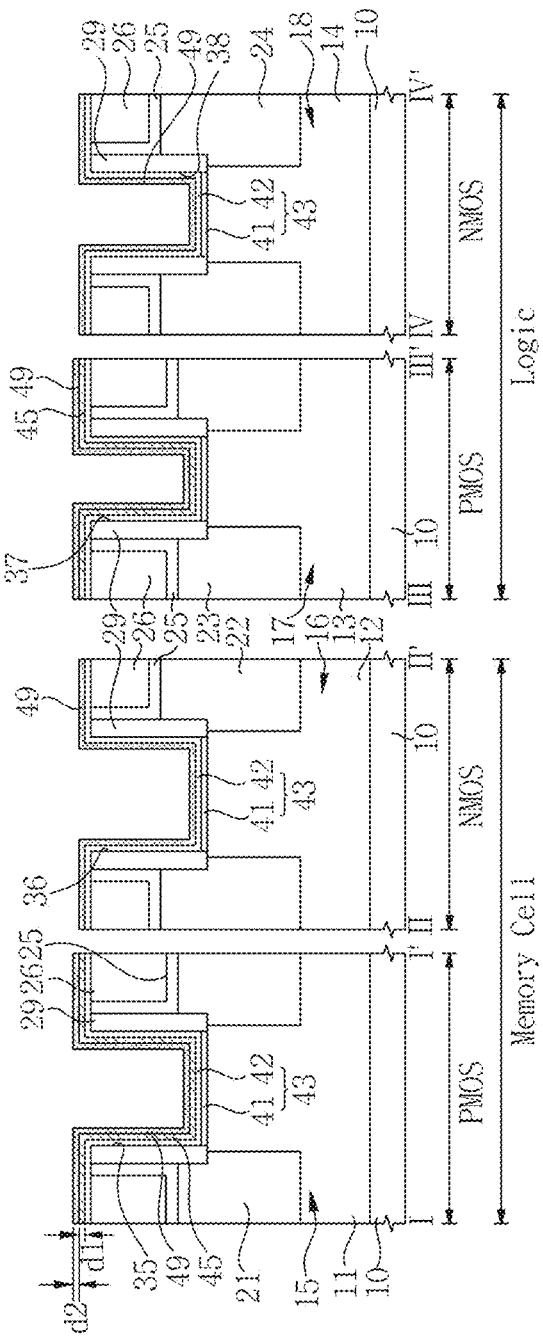

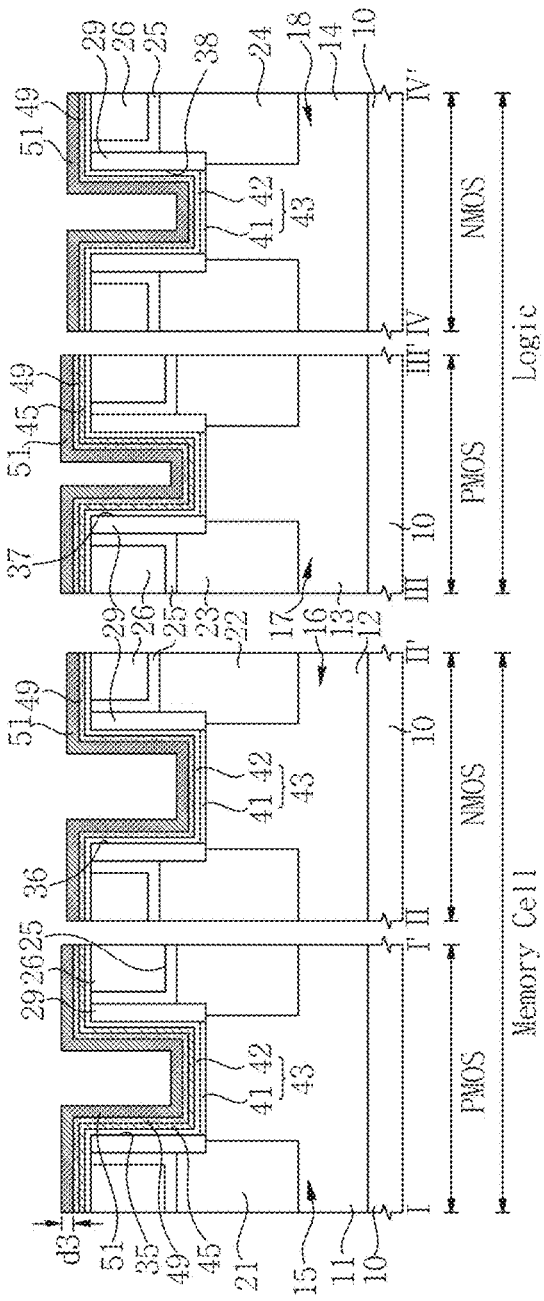
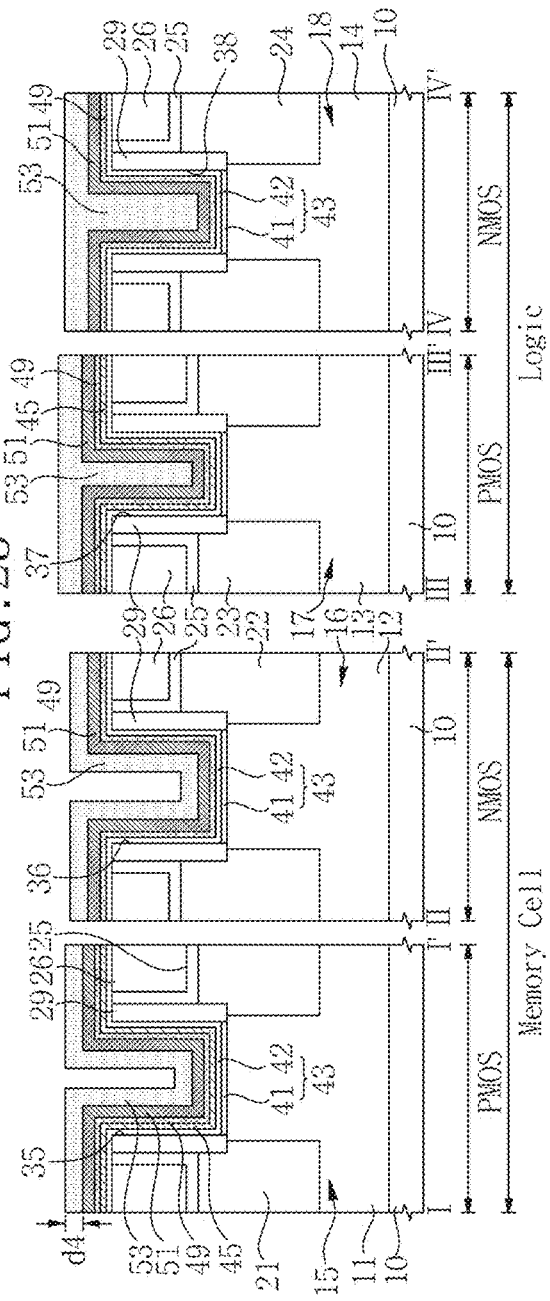

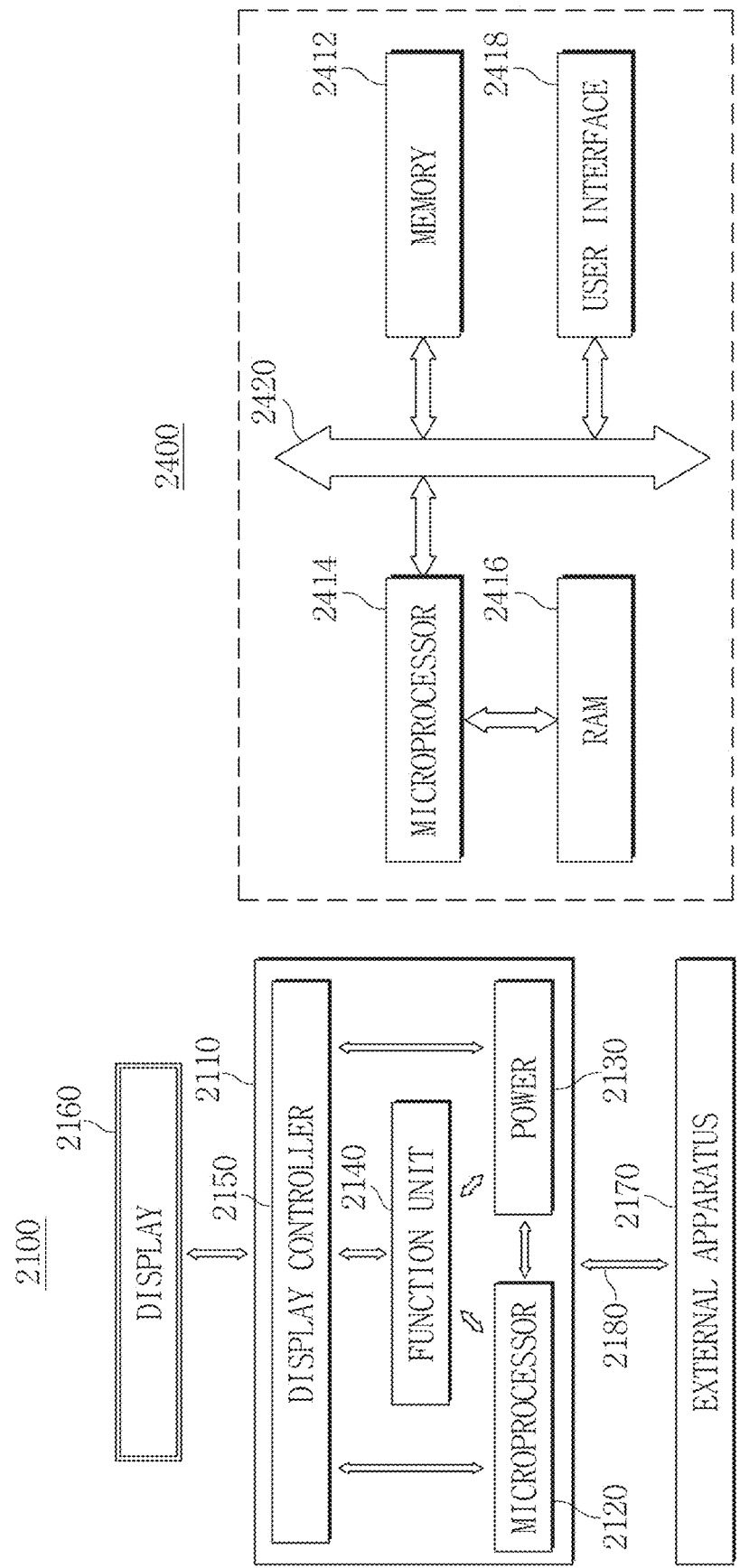

SEMICONDUCTOR DEVICE HAVING WORK-FUNCTION METAL AND METHOD OF FORMING THE SAME

CROSS-REFERENCE TO RELATED APPLICATION

This application is a continuation of U.S. application Ser. No. 17/958,805, filed Oct. 3, 2022, which is a continuation of U.S. application Ser. No. 17/335,174, filed Jun. 1, 2021, which is a continuation of U.S. application Ser. No. 16/921,037, filed Jul. 6, 2020, which is a continuation of U.S. application Ser. No. 16/459,889, filed on Jul. 2, 2019, which is a continuation of U.S. application Ser. No. 15/468,631, filed on Mar. 24, 2017, which is a divisional of U.S. application Ser. No. 14/972,704, filed on Dec. 17, 2015, which claims priority under 35 U.S.C. § 119 to Korean Patent Application No. 10-2015-0014418 filed on Jan. 29, 2015, the entire contents of each of the above-referenced applications are hereby incorporated by reference.

BACKGROUND

Field

Example embodiments of the inventive concepts relate to a semiconductor device having a work-function metal.

Description of Related Art

Widths of gate electrodes are being gradually decreased by requiring highly integrated semiconductor devices. A uniform electrical characteristic may be required for the semiconductor devices formed in memory cell areas and high current driving capability may be required for the semiconductor devices formed in logic areas. When gate electrodes for implementing the uniform electrical characteristic and the gate electrodes for implementing the high current driving capability in a single semiconductor chip are formed, there are a variety of difficulties to be faced.

SUMMARY

Example embodiments of the inventive concepts provide a semiconductor device having an improved electrical characteristic while simplifying a process.

Example embodiments of the inventive concepts provide a method of forming a semiconductor device having an improved electrical characteristic while simplifying a process.

The technical objectives of the inventive concepts are not limited to the above disclosure; other objectives may become apparent to those of ordinary skill in the art based on the following descriptions.

In accordance with example embodiments of the inventive concepts, a semiconductor device includes a substrate having a memory cell area and a logic area, a first active area and a second active area in the memory cell area on the substrate, a third active area in the logic area on the substrate, an insulating layer on the substrate and configured to cover the first, second and third active areas, a first gate electrode configured to pass through the insulating layer, cover a side surface of the first active area, and cross the first active area, a second gate electrode configured to pass through the insulating layer, cover a side surface of the second active area, and cross the second active area, and a third gate electrode configured to pass through the insulating layer, cover a side surface of the third active area, cross the third active area, having a width smaller than the first gate electrode and the second gate electrode, and not having the first and second conductive layers. The first gate electrode includes a first P-work-function metal layer in the first active area, a first capping layer on the first P-work-function metal layer, a first N-work-function metal layer on the first capping layer, a first barrier metal layer on the first N-work-function metal layer, and a first conductive layer on the first barrier metal layer and having a different material from the first barrier metal layer. The second gate electrode includes a second capping layer in the second active area, a second N-work-function metal layer on the second capping layer, a second barrier metal layer on the second N-work-function metal layer, and a second conductive layer on the second barrier metal layer and having a different material from the second barrier metal layer. The third gate electrode includes a second P-work-function metal layer in the third active area, a third capping layer on the second P-work-function metal layer, a third N-work-function metal layer on the third capping layer, and a third barrier metal layer on the third N-work-function metal layer.

The first N-work-function metal layer, the second N-work-function metal layer, and the third N-work-function metal layer may be thicker than the first P-work-function metal layer and the second P-work-function metal layer.

The first barrier metal layer, the second barrier metal layer, and the third barrier metal layer may be thicker than the first N-work-function metal layer, the second N-work-function metal layer, and the third N-work-function metal layer.

The first P-work-function metal layer and the second P-work-function metal layer may include titanium nitride (TiN).

The first capping layer, the second capping layer, and the third capping layer may include TiN.

The first N-work-function metal layer, the second N-work-function metal layer, and the third N-work-function metal layer may include one of titanium aluminum carbide (TiAlC) and titanium aluminide (TiAl).

The first barrier metal layer, the second barrier metal layer, and the third barrier metal layer may include TiN.

The first conductive layer and the second conductive layer may include tungsten (W).

The device may further include a gate dielectric layer between the first active area and the first gate electrode, between the second active area and the second gate electrode, and between the third active area and the third gate electrode, wherein an upper surface of the gate dielectric layer and an upper surface of the first, second and third gate electrodes are at a same level.

The first P-work-function metal layer, the second capping layer, and the second P-work-function metal layer may directly contact the gate dielectric layer.

The second gate electrode may not have the first P-work-function metal layer and the second P-work-function metal layer.

Upper surfaces of the insulating layer, the first P-work-function metal layer, the second P-work-function metal layer, the first capping layer, the second capping layer, the third capping layer, the first N-work-function metal layer, the second N-work-function metal layer, the third N-work-function metal layer, the first barrier metal layer, the second barrier metal layer, the third barrier metal layer, the first conductive layer, and the second conductive layer may be at a same level.

The device may further include a first source/drain on the first active area and having an upper portion adjacent to an outer sidewall of the first gate electrode, the upper portion having an upper surface at a level higher than a lower surface of the first gate electrode, a second source/drain on the second active area and having an upper portion adjacent to an outer sidewall of the second gate electrode, the upper portion having an upper surface at a level higher than a lower surface of the second gate electrode, and a third source/drain on the third active area and having an upper portion adjacent to an outer sidewall of the third gate electrode, the upper portion having an upper surface at a level higher than a lower surface of the third gate electrode, wherein the upper surface of the upper portion of the second source/drain is at a different level than the upper surface of the upper portion of the first source/drain and the upper surface of the upper portion of the third source/drain.

The upper surface of the upper portion of the second source/drain may be at a level from the upper surface of the upper portion of the first source/drain and the upper surface of the upper portion of the third source/drain.

The first source/drain and the third source/drain may include silicon-germanium (SiGe). The second source/drain may include one of silicon carbide (SiC), silicon (Si), and a combination thereof.

The device may further include a fourth active area in the logic area on the substrate, and a fourth gate electrode configured to pass through the insulating layer, cover a side surface of the fourth active area, and cross the fourth active area, the fourth gate electrode having a width smaller than the first gate electrode and the second gate electrode and not having the first and second conductive layers. The fourth gate electrode may include a fourth capping layer in the fourth active area, a fourth N-work-function metal layer on the fourth capping layer, and a fourth barrier metal layer on the fourth N-work-function metal layer.

The first gate electrode may include the first barrier metal layer surrounding side surfaces and a bottom surface of the first conductive layer, the first N-work-function metal layer surrounding side surfaces and a bottom surface of the first barrier metal layer, the first capping layer surrounding side surfaces and a bottom surface of the first N-work-function metal layer, and the first P-work-function metal layer surrounding side surfaces and a bottom surface of the first capping layer. The second gate electrode may include the second barrier metal layer surrounding side surfaces and a bottom surface of the second conductive layer, the second N-work-function metal layer surrounding side surfaces and a bottom surface of the second barrier metal layer, and the second capping layer surrounding side surfaces and a bottom surface of the second N-work-function metal layer. The third gate electrode may include the third N-work-function metal layer surrounding side surfaces and a bottom surface of the third barrier metal layer, the third capping layer surrounding side surfaces and a bottom surface of the third N-work-function metal layer, and the second P-work-function metal layer surrounding side surfaces and a bottom surface of the third capping layer.

In accordance with example embodiments of the inventive concepts, a semiconductor device includes a substrate having a memory cell area and a logic area, a first active area in the memory cell area on the substrate, a second active area in the logic area on the substrate, an insulating layer on the substrate, the insulating layer configured to cover the first and second active areas, a first gate electrode configured to pass through the insulating layer, cover a side surface of the first active area, and cross the first active area, and a second gate electrode configured to pass through the insulating layer, cover a side surface of the second active area, and cross the second active area, the second gate electrode having a width smaller than the first gate electrode and not having the first conductive layer. The first gate electrode includes a first work-function metal layer in the first active area, a first barrier metal layer on the first work-function metal layer, and a conductive layer on the first barrier metal layer, the conductive layer having a different material from the first barrier metal layer. The second gate electrode includes a second first work-function metal layer in the second active area, and a second barrier metal layer on the second first work-function metal layer.

In accordance with example embodiments of the inventive concepts, a semiconductor device includes a substrate having a memory cell area and a logic area, a first active area and a second active area in the memory cell area on the substrate, a third active area and a fourth active area in the logic area on the substrate, an insulating layer on the substrate, the insulating layer configured to cover the first to fourth active areas, a first gate electrode configured to pass through the insulating layer, cover a side surface of the first active area, and cross the first active area, a second gate electrode configured to pass through the insulating layer, cover a side surface of the second active area, and cross the second active area, a third gate electrode configured to pass through the insulating layer, cover a side surface of the third active area, cross the third active area, and have a width smaller than the first gate electrode and the second gate electrode, and a fourth gate electrode configured to pass through the insulating layer, cover a side surface of the fourth active area, and cross the fourth active area, the fourth gate electrode having a width smaller than the first gate electrode and the second gate electrode and not having the first and second conductive layers. The first gate electrode includes a first P-work-function metal layer in the first active area, a first capping layer on the first P-work-function metal layer, a first N-work-function metal layer on the first capping layer, a first barrier metal layer on the first N-work-function metal layer, and a first conductive layer on the first barrier metal layer, the first conductive layer having a different material from the first barrier metal layer. The second gate electrode includes a second capping layer in the second active area, a second N-work-function metal layer on the second capping layer, a second barrier metal layer on the second N-work-function metal layer, and a second conductive layer on the second barrier metal layer, the second conductive layer having a different material from the second barrier metal layer. The third gate electrode includes a second P-work-function metal layer in the third active area, a third capping layer on the second P-work-function metal layer, a third N-work-function metal layer on the third capping layer, and a third barrier metal layer on the third N-work-function metal layer. The fourth gate electrode includes a fourth capping layer in the fourth active area, a fourth N-work-function metal layer on the fourth capping layer, a fourth barrier metal layer on the fourth N-work-function metal layer, and a third conductive layer on the fourth barrier metal layer, the third conductive layer having a different material from the fourth barrier metal layer.

In accordance with example embodiments of the inventive concepts, a method of forming a semiconductor device includes preparing a substrate having a memory cell area and a logic area, forming a first active area and a second active area in the memory cell area on the substrate, forming a third active area in the logic area on the substrate, forming an insulating layer on the substrate to cover the first, second and third active areas, forming a first trench configured to pass through the insulating layer and cross the first active area, a second trench configured to pass through the insulating layer and cross the second active area, and a third trench configured to pass through the insulating layer and cross the third active area, the third trench having a horizontal width smaller than a horizontal width of the first trench and the second trench, forming a P-work-function metal layer on bottom surfaces and side surfaces of the first trench and the third trench, forming a capping layer on bottom surfaces and side surfaces of the first, second and third trenches such that the P-work-function metal layer remains between the first active area and the capping layer, and between the third active area and the capping layer, forming an N-work-function metal layer on the capping layer in the first, second and third trenches, forming a barrier metal layer on the N-work-function metal layer in the first, second and third trenches, the barrier metal layer completely filling the third trench, and forming a conductive layer on the barrier metal layer in the first and the second trenches, the conductive layer having a different material from the barrier metal layer.

The N-work-function metal layer may be thicker than the P-work-function metal layer.

The barrier metal layer may be thicker than the N-work-function metal layer.

A gate dielectric layer may be formed between the first active area and the P-work-function metal layer, between the second active area and the capping layer, and between the third active area and the P-work-function metal layer.

The capping layer may directly contact the gate dielectric layer in the second trench. The P-work-function metal layer may directly contact the gate dielectric layer in the first and third trenches.

Upper surfaces of the insulating layer, the P-work-function metal layer, the capping layer, the N-work-function metal layer, the barrier metal layer, and the conductive layer may be at a same level.

The method may further include forming a first source/drain on the first active area adjacent to an outer sidewall of the first trench such that an upper portion of the first source/drain has an upper surface at a level higher than a lower surface of the P-work-function metal layer, forming a second source/drain on the second active area adjacent to an outer sidewall of the second trench such that an upper portion of the second source/drain has an upper surface at a level higher than a lower surface of the capping layer, and forming a third source/drain on the third active area adjacent to an outer sidewall of the third trench such that an upper portion of the third source/drain has an upper surface at a level higher than a lower surface of the P-work-function metal layer, wherein the upper surface of the upper portion of the second source/drain may be at a different level than the upper surface of the upper portion of the first source/drain and the upper surface of the upper portion of the third source/drain.

The upper surface of the upper portion of the second source/drain may be at a level higher than the upper surface of the upper portion of the first source/drain and the upper surface of the upper portion of the third source/drain.

In accordance with example embodiments of the inventive concepts, a semiconductor device includes a substrate having a memory cell area and a logic area, a first well in the memory cell area on the substrate, a second well in the logic area on the substrate, an insulating layer on the substrate and configured to cover the first and second wells, a first metal structure on the first well and configured to penetrate the insulating layer, the first metal structure including a plurality of first metal layers, the plurality of first metal layers including a work-function metal, and a second metal structure on the second well and configured to penetrate the insulating layer, the second metal structure having a different width from than the first metal structure, the second metal structure including a plurality of second metal layers, the plurality of second metal layers including the work-function metal.

The width of the second metal structure may be smaller than the width of the first metal structure.

The work-function metal may be one of titanium nitride (TiN), titanium aluminum carbide (TiAlC) and titanium aluminide (TiAl).

The device may further include a gate dielectric layer between the first well and the first metal structure, and between the second well and the second metal structure, wherein an upper surface of the gate dielectric layer and an upper surface of the first and second metal structures may be at a same level.

The device may further include a first source/drain on the first well, the first source/drain having an upper portion adjacent to an outer sidewall of the first metal structure, the upper portion having an upper surface at a level higher than a lower surface of the first metal structure, and a second source/drain on the second well, the second source/drain having an upper portion adjacent to an outer sidewall of the second metal structure, the upper portion having an upper surface at a level higher than a lower surface of the second metal structure, wherein the first source/drain and the second source/drain may include silicon-germanium (SiGe).

Details of other embodiments are included in detailed explanations and the drawings.

BRIEF DESCRIPTION OF THE DRAWINGS

The foregoing and other features and advantages of the inventive concepts will be apparent from the more particular description of example embodiments of the inventive concepts, as illustrated in the accompanying drawings in which like reference characters refer to the same parts throughout the different views. The drawings are not necessarily to scale, emphasis instead being placed upon illustrating the principles of the inventive concepts. In the drawings:

FIGS. 1A to 1D are cross-sectional views for describing a semiconductor device in accordance with example embodiments of the inventive concepts;

FIG. 1A is a cross-sectional view taken along line I-I' of FIG. 3, FIG. 1B is a cross-sectional view taken along line II-IF of FIG. 3, FIG. 1C is a cross-sectional view taken along line of FIG. 3, and FIG. 1D is a cross-sectional view taken along line IV-IV' of FIG. 3;

FIG. 4 is a cross-sectional view taken along lines V-V' and VI-VI' of FIG. 3;

FIG. 5 is a cross-sectional view taken along lines VII-VII' and VIII-VIII' of FIG. 3;

FIG. 6 is a cross-sectional view taken along line IX-IX' of FIG. 3;

FIG. 7 is a cross-sectional view taken along line X-X' of FIG. 3;

FIGS. 16 to 27 are cross-sectional views taken along lines I-I', and IV-IV' of FIG. 3 for describing a method of forming a semiconductor device according to example embodiments of the inventive concepts; and FIGS. 28 and 29 are system block diagrams of electronic devices according to example embodiments of the inventive concepts.

DETAILED DESCRIPTION

Figure 2A:
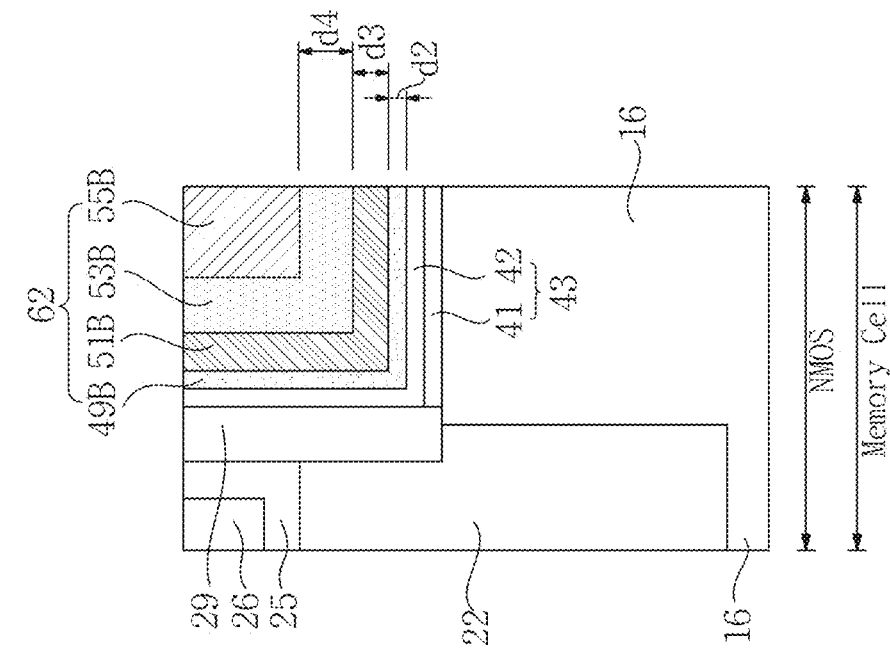
FIGS. 2A to 2D are partially enlarged views showing parts of FIGS. 1A to 1D in detail.
Figure 2B:
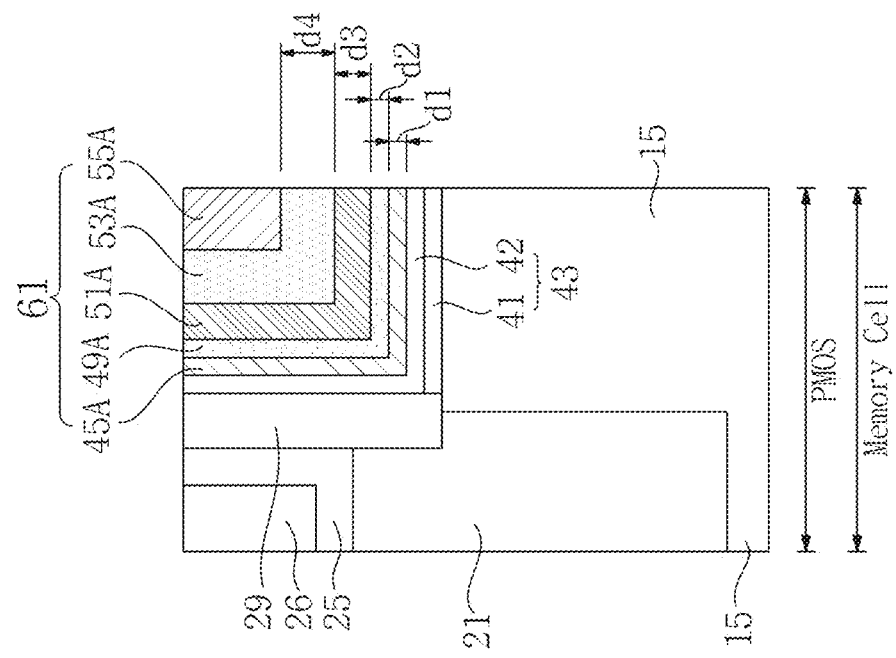
Figure 2D:
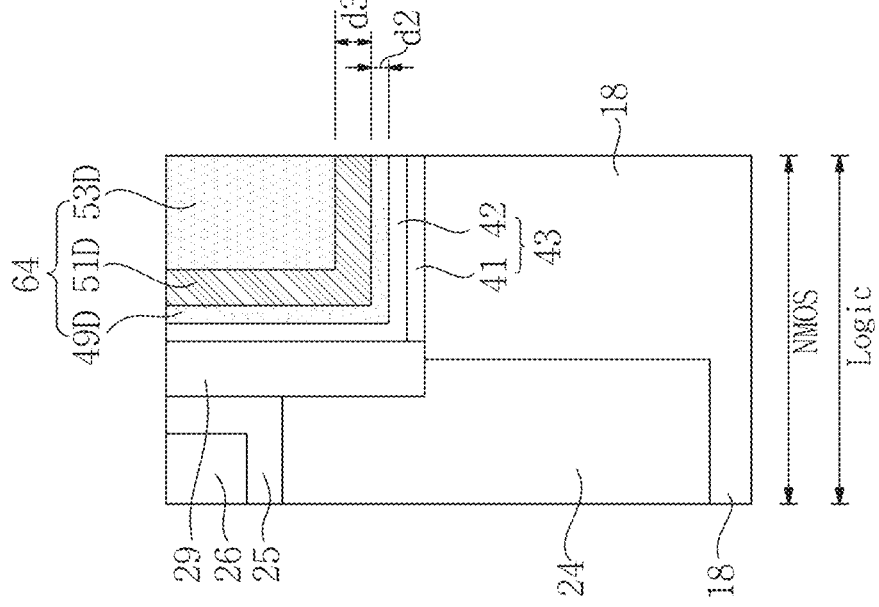
Figure 2C:
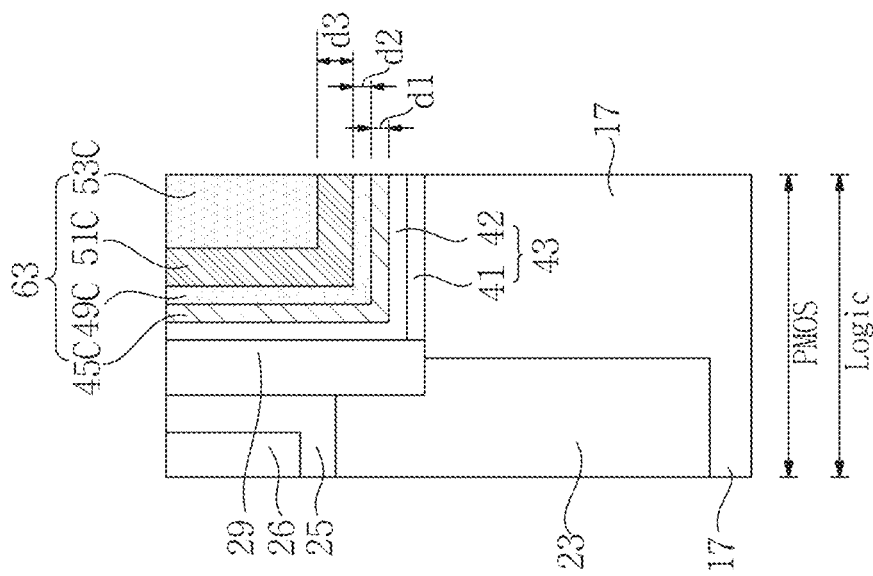

Advantages and features of the inventive concepts and methods of accomplishing them will be made apparent with reference to the accompanying drawings and some embodiments to be described below. The inventive concepts may, however, be embodied in various different forms, and should be construed as limited, not by the example embodiments set forth herein, but only by the accompanying claims. Rather, these example embodiments are provided so that this disclosure is thorough and complete and fully conveys the inventive concepts to those skilled in the art.

The terminology used herein is for the purpose of describing particular example embodiments only and is not intended to be limiting of the present inventive concepts. As used herein, the singular forms "a," "an," and "the" are intended to include the plural forms as well, unless the context clearly indicates otherwise. It will be further understood that the terms "comprises," "comprising," "includes," and/or "including," when used in this specification, specify the presence of stated features, integers, steps, operations, elements, and/or components, but do not preclude the presence or addition of one or more other features, integers, steps, operations, elements, components, and/or groups thereof.

It will be understood that when an element or layer is referred to as being "on," "connected to," or "coupled to" another element or layer, it can be directly on, connected or coupled to the other element or layer or intervening elements or layers may be present. In contrast, when an element is referred to as being "directly on," "directly connected to," or "directly coupled to" another element or layer, there are no intervening elements or layers present. As used herein, the term "and/or" includes any and all combinations of one or more of the associated listed items.

Spatially relative terms, such as "beneath," "below," "lower," "above," "upper," and the like, may be used herein for ease of description in describing one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein may be interpreted accordingly.

Example embodiments of the inventive concepts will be described with reference to cross-sectional views and/or plan views, which are ideal example views. Thicknesses of layers and areas are exaggerated for effective description of the technical contents in the drawings. Forms of the embodiments may be modified by the manufacturing technology and/or tolerance. Therefore, example embodiments of the inventive concepts are not intended to be limited to illustrated specific forms, and include modifications of forms generated according to manufacturing processes. For example, an etching area illustrated at a right angle may be round or have a predetermined or given curvature. Therefore, areas illustrated in the drawings have overview properties, and shapes of the areas are illustrated special forms of the areas of a device, and are not intended to be limited to the scope of the inventive concepts.

Like numbers refer to like elements throughout. Thus, the same or similar numbers may be described with reference to other drawings even if they are neither mentioned nor described in the corresponding drawing. Also, elements that are not denoted by reference numbers may be described with reference to other drawings.

Terms such as "front side," and "back side" may be used in a relative sense herein to facilitate easier understanding of the inventive concepts. Accordingly, "front side," and "back side" may not refer to any specific direction, location, or component, and may be used interchangeably. For example, "front side" may be interpreted as "back side" and vice versa. Also, "front side" may be expressed as "first side," and "back side" may be expressed as "second side," and vice versa. However, "front side," and "back side" cannot be used interchangeably in the same example embodiment.

The term "near" is intended to mean that one among two or more components is located within relatively close proximity of a certain other component. For example, it should be understood that when a first end is near a first side, the first end may be closer to the first side than a second end, or the first end may be closer to the first side than to a second side.

FIGS. 1A to 1D are cross-sectional views for describing a semiconductor device in accordance with example embodiments of the inventive concepts.

Referring to FIGS. 1A to 1D, a first well 11, a second well 12, a third well 13, a fourth well 14, a first fin active area 15, a second fin active area 16, a third fin active area 17, a fourth fin active area 18, first sources/drains 21, second sources/drains 22, third sources/drains 23, fourth sources/drains 24, an etch stop layer 25, a lower insulating layer 26, spacers 29, a first trench 35, a second trench 36, a third trench 37, a fourth trench 38, a gate dielectric layer 43, a first P-work-function metal layer 45A, a second P-work-function metal layer 45C, a first capping layer 49A, a second capping layer 49B, a third capping layer 49C, a fourth capping layer 49D, a first N-work-function metal layer 51A, a second N-work-function metal layer 51B, a third N-work-function metal layer 51C, a fourth N-work-function metal layer 51D, a first barrier metal layer 53A, a second barrier metal layer 53B, a third barrier metal layer 53C, a fourth barrier metal layer 53D, a first conductive layer 55A, a second conductive layer 55B, and an upper insulating layer 66 may be formed on a substrate 10.

The first P-work-function metal layer 45A, the first capping layer 49A, the first N-work-function metal layer 51A, the first barrier metal layer 53A, and the first conductive layer 55A may configure a first gate electrode 61. The second capping layer 49B, the second N-work-function metal layer 51B, the second barrier metal layer 53B, and the second conductive layer 55B may configure a second gate electrode 62. The second P-work-function metal layer 45C, the third capping layer 49C, the third N-work-function metal layer 51C, and the third barrier metal layer 53C may configure a third gate electrode 63. The fourth capping layer 49D, the fourth N-work-function metal layer 51D, and the fourth barrier metal layer 53D may configure a fourth gate electrode 64.

The substrate 10 may include a memory cell area and a logic area. Each of the memory cell area and the logic area may include a PMOS area and an NMOS area. The gate dielectric layer 43 may include a lower gate dielectric layer 41 and an upper gate dielectric layer 42.

The first trench 35 may have a first width L1. The second trench 36 may have a second width L2. The third trench 37 may have a third width L3. The fourth trench 38 may have a fourth width L4. The third width L3 may be smaller than the first width L1 and the second width L2. The fourth width L4 may be smaller than the first width L1 and the second width L2. The second width L2 may be substantially the same as the first width L1. The fourth width L4 may be substantially the same as the third width L3.

The first well 11, the first fin active area 15, the first sources/drains 21, and the first trench 35 may be formed in the PMOS area of the memory cell area. The gate dielectric layer 43 and the first gate electrode 61 may be formed in the first trench 35. The gate dielectric layer 43 may surround side surfaces and a bottom of the first gate electrode 61. The upper gate dielectric layer 42 may directly contact a bottom and side surfaces of the first P-work-function metal layer 45A. The first P-work-function metal layer 45A may surround side surfaces and a bottom of the first capping layer 49A. The first capping layer 49A may surround side surfaces and a bottom of the first N-work-function metal layer 51A. The first N-work-function metal layer 51A may surround side surfaces and a bottom of the first barrier metal layer 53A. The first barrier metal layer 53A may surround side surfaces and a bottom of the first conductive layer 55A. The first conductive layer 55A may completely fill the first trench 35.

The second well 12, the second fin active area 16, the second sources/drains 22, and the second trench 36 may be formed in the NMOS area of the memory cell area. The gate dielectric layer 43 and the second gate electrode 62 may be formed in the second trench 36. The gate dielectric layer 43 may surround side surfaces and a bottom of the second gate electrode 62. The upper gate dielectric layer 42 may directly contact a bottom and side surfaces of the second capping layer 49B. The second capping layer 49B may surround side surfaces and a bottom of the second N-work-function metal layer 51B. The second N-work-function metal layer 51B may surround side surfaces and a bottom of the second barrier metal layer 53B. The second barrier metal layer 53B may surround side surfaces and a bottom of the second conductive layer 55B. The second conductive layer 55B may completely fill the second trench 36.

The third well 13, the third fin active area 17, the third sources/drains 23, and the third trench 37 may be formed in the PMOS area of the logic area. The gate dielectric layer 43 and the third gate electrode 63 may be formed in the third trench 37. The gate dielectric layer 43 may surround side surfaces and a bottom of the third gate electrode 63. The upper gate dielectric layer 42 may directly contact a bottom and side surfaces of the second P-work-function metal layer 45C. The second P-work-function metal layer 45C may surround side surfaces and a bottom of the third capping layer 49C. The third capping layer 49C may surround side surfaces and a bottom of the third N-work-function metal layer 51C. The third N-work-function metal layer 51C may surround side surfaces and a bottom of the third barrier metal layer 53C. The third barrier metal layer 53C may completely fill the third trench 37.

The fourth well 14, the fourth fin active area 18, the fourth sources/drains 24, and the fourth trench 38 may be formed in the NMOS area of the logic area. The gate dielectric layer 43 and the fourth gate electrode 64 may be formed in the fourth trench 38. The gate dielectric layer 43 may surround side surfaces and a bottom of the fourth gate electrode 64. The upper gate dielectric layer 42 may directly contact a bottom and side surfaces of the fourth capping layer 49D. The fourth capping layer 49D may surround side surfaces and a bottom of the fourth N-work-function metal layer 51D. The fourth N-work-function metal layer 51D may surround side surfaces and a bottom of the fourth barrier metal layer 53D. The fourth barrier metal layer 53D may completely fill the fourth trench 38.

Upper ends of the lower insulating layer 26, the etch stop layer 25, the spacers 29, the upper gate dielectric layer 42, the first P-work-function metal layer 45A, the first capping layer 49A, the first N-work-function metal layer 51A, the first barrier metal layer 53A, the first conductive layer 55A, the second capping layer 49B, the second N-work-function metal layer 51B, the second barrier metal layer 53B, the second conductive layer 55B, the second P-work-function metal layer 45C, the third capping layer 49C, the third N-work-function metal layer 51C, the third barrier metal layer 53C, the fourth capping layer 49D, the fourth N-work-function metal layer 51D, and the fourth barrier metal layer 53D may be formed to have substantially the same plane.

The first P-work-function metal layer 45A and the second P-work-function metal layer 45C may include the same material simultaneously formed using the same thin film formation process. The first capping layer 49A, the second capping layer 49B, the third capping layer 49C, and the fourth capping layer 49D may include the same material simultaneously formed using the same thin film formation process. The first N-work-function metal layer 51A, the second N-work-function metal layer 51B, the third N-work-function metal layer 51C, and the fourth N-work-function metal layer 51D may include the same material simultaneously formed using the same thin film formation process. The first barrier metal layer 53A, the second barrier metal layer 53B, the third barrier metal layer 53C, and the fourth barrier metal layer 53D may include the same material simultaneously formed using the same thin film formation process. The first conductive layer 55A and the second conductive layer 55B may include the same material simultaneously formed using the same thin film formation process. The first conductive layer 55A and the second conductive layer 55B are not present in the third trench 37 and the fourth trench 38.

The first sources/drains 21 may be formed in the first fin active area 15. The first sources/drains 21 may be aligned outside the first gate electrode 61. Upper ends of the first sources/drains 21 may protrude to a level higher than an adjacent part of a lower surface of the first gate electrode 61. The second sources/drains 22 may be formed in the second fin active area 16. The second sources/drains 22 may be aligned outside the second gate electrode 62. Upper ends of the second sources/drains 22 may protrude to a level higher than an adjacent part of a lower surface of the second gate electrode 62. The upper ends of the second sources/drains 22 may be formed at a level higher than the upper ends of the first sources/drains 21.

The third sources/drains 23 may be formed in the third fin active area 17. The third sources/drains 23 may be aligned outside the third gate electrode 63. Upper ends of the third sources/drains 23 may protrude to a level higher than an adjacent part of a lower surface of the third gate electrode 63. The fourth sources/drains 24 may be formed in the fourth fin active area 18. The fourth sources/drains 24 may be aligned outside the fourth gate electrode 64. Upper ends of the fourth sources/drains 24 may protrude to a level higher than an adjacent part of a lower surface of the fourth gate electrode 64. The upper ends of the fourth sources/drains 24 may be formed at a level higher than the upper ends of the third sources/drains 23.

FIGS. 2A to 2D are partially enlarged views showing parts of FIGS. 1A to 1D in detail.

Referring to FIGS. 2A to 2D, each of the first and second P-work-function metal layers 45A and 45C may have a first thickness d1. Each of the first to fourth capping layers 49A, 49B, 49C, and 49D may have a second thickness d2. Each of the first to fourth N-work-function metal layers 51A, 51B, 51C, and 51D may have a third thickness d3. The third thickness d3 may be greater than the first thickness d1. The third thickness d3 may be greater than the second thickness d2. Each of the first and second barrier metal layers 53A and 53B may have a fourth thickness d4. The fourth thickness d4 may be greater than the third thickness d3.

Figure 3:
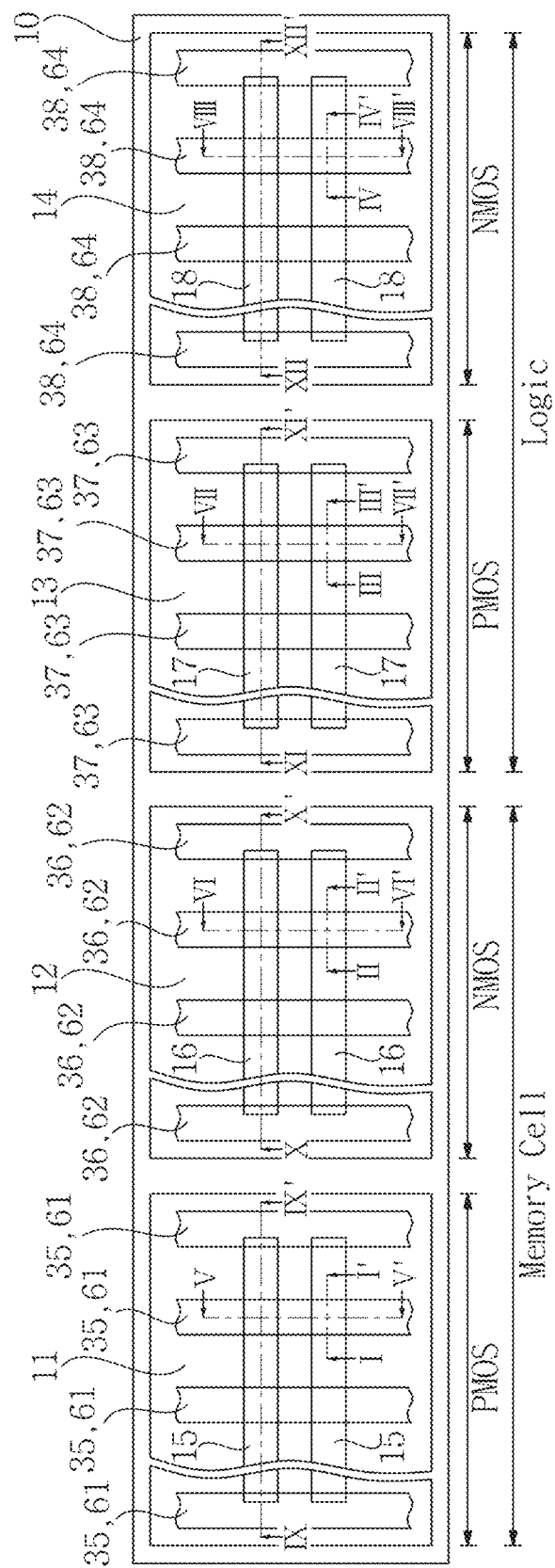
FIG. 3 is a layout for describing a semiconductor device in accordance with example embodiments of the inventive concepts.

FIG. 3 is a layout for describing a semiconductor device in accordance with example embodiments of the inventive concepts. FIG. 1A is a cross-sectional view taken along line I-I' of FIG. 3, FIG. 1B is a cross-sectional view taken along line II-IF of FIG. 3, FIG. 1C is a cross-sectional view taken along line of FIG. 3, and FIG. 1D is a cross-sectional view taken along line IV-IV' of FIG. 3.

Referring to FIG. 3, a substrate 10 may include a memory cell area and a logic area. Each of the memory cell area and the logic area may include a PMOS area and an NMOS area.

A first well 11 may be formed in the PMOS area of the memory cell area on the substrate 10. First fin active areas 15 may be formed on the first well 11. The first fin active areas 15 may be parallel to each other. First trenches 35 may cross the first fin active areas 15. The first trenches 35 may be parallel to each other. First gate electrodes 61 may be formed in the first trenches 35. The first gate electrodes 61 may be parallel to each other. The first gate electrodes 61 may cross the first fin active areas 15.

A second well 12 may be formed in the NMOS area of the memory cell area on the substrate 10. Second fin active areas 16 may be formed on the second well 12. The second fin active areas 16 may be parallel to each other. Second trenches 36 may cross the second fin active areas 16. The second trenches 36 may be parallel to each other. Second gate electrodes 62 may be formed in the second trenches 36. The second gate electrodes 62 may be parallel to each other. The second gate electrodes 62 may cross the second fin active areas 16.

A third well 13 may be formed in the PMOS area of the logic area on the substrate 10. Third fin active areas 17 may be formed on the third well 13. The third fin active areas 17 may be parallel to each other. Third trenches 37 may cross the third fin active areas 17. The third trenches 37 may be parallel to each other. Third gate electrodes 63 may be formed in the third trenches 37. The third gate electrodes 63 may be parallel to each other. The third gate electrodes 63 may cross the third fin active areas 17.

A fourth well 14 may be formed in the NMOS area of the logic area on the substrate 10. Fourth fin active areas 18 may be formed on the fourth well 14. The fourth fin active areas 18 may be parallel to each other. Fourth trenches 38 may cross the fourth fin active areas 18. The fourth trenches 38 may be parallel to each other. Fourth gate electrodes 64 may be formed in the fourth trenches 38. The fourth gate electrodes 64 may be parallel to each other. The fourth gate electrodes 64 may cross the fourth fin active areas 18.

FIG. 4 is a cross-sectional view taken along lines V-V' and VI-VI' of FIG. 3, and FIG. 5 is a cross-sectional view taken along lines VII-VII' and VIII-VIII' of FIG. 3.

Referring to FIGS. 3, 4, and 5, each of first fin active areas 15 may have a height greater than a width. Upper ends of the first fin active areas 15 may be roundly formed. An isolation layer 19 may be formed between the first fin active areas 15 and on side surfaces of the first fin active areas 15. An upper end of the isolation layer 19 may be formed at a level lower than the upper ends of the first fin active areas 15. A first gate electrode 61 may cover upper parts and the side surfaces of the first fin active areas 15 and extend on the isolation layer 19. The first gate electrode 61 may extend between the first fin active areas 15. A lower end of the first gate electrode 61 may be formed at a level lower than the upper ends of the first fin active areas 15. The isolation layer 19 may include silicon oxide, silicon nitride, silicon oxynitride, or a combination thereof.

Each of second fin active areas 16 may have a height greater than a width. Upper ends of the second fin active areas 16 may be roundly formed. The isolation layer 19 may be formed between the second fin active areas 16 and on side surfaces of the second fin active areas 16. The upper end of the isolation layer 19 may be formed at a level lower than the upper ends of the second fin active areas 16. A second gate electrode 62 may cover upper parts and the side surfaces of the second fin active areas 16 and extend on the isolation layer 19. The second gate electrode 62 may extend between the second fin active areas 16. A lower end of the second gate electrode 62 may be formed at a level lower than the upper ends of the second fin active areas 16.

Each of third fin active areas 17 may have a height greater than a width. Upper ends of the third fin active areas 17 may be roundly formed. The isolation layer 19 may be formed between the third fin active areas 17 and on side surfaces of the third fin active areas 17. The upper end of the isolation layer 19 may be formed at a level lower than the upper ends of the third fin active areas 17. A third gate electrode 63 may cover upper parts and the side surfaces of the third fin active areas 17 and extend on the isolation layer 19. The third gate electrode 63 may extend between the third fin active areas 17. A lower end of the third gate electrode 63 may be formed at a level lower than the upper ends of the third fin active areas 17.

Each of fourth fin active areas 18 may have a height greater than a width. Upper ends of the fourth fin active areas 18 may be roundly formed. The isolation layer 19 may be formed between the fourth fin active areas 18 and on side surfaces of the fourth fin active areas 18. The upper end of the isolation layer 19 may be formed at a level lower than the upper ends of the fourth fin active areas 18. A fourth gate electrode 64 may cover upper parts and the side surfaces of the fourth fin active areas 18 and extend on the isolation layer 19. The fourth gate electrode 64 may extend between the fourth fin active areas 18. A lower end of the fourth gate electrode 64 may be formed at a level lower than the upper ends of the fourth fin active areas 18.

FIG. 6 is a cross-sectional view taken along line IX-IX' of FIG. 3.

Referring to FIGS. 3 and 6, the first fin active areas 15 may be defined by the isolation layer 19 on the first well 11. The first gate electrodes 61 may cross the first fin active areas 15 and extend on the isolation layer 19. The first sources/drains 21 may be formed on the first fin active areas 15 between the first gate electrodes 61. Bottoms of the first sources/drains 21 may be formed at a level lower than the upper ends of the first fin active areas 15. Upper ends of the first sources/drains 21 may be formed at a level higher than the upper ends of the first fin active areas 15.

FIG. 7 is a cross-sectional view taken along line X-X' of FIG. 3.

Referring to FIGS. 3 and 7, the second fin active areas 16 may be defined by the isolation layer 19 on the second well 12. The second gate electrodes 62 may cross the second fin active areas 16 and extend on the isolation layer 19. The second sources/drains 22 may be formed on the second fin active areas 16 between the second gate electrodes 62. Bottoms of the second sources/drains 22 may be formed at a level lower than the upper ends of the second fin active areas 16. Upper ends of the second sources/drains 22 may be formed at a level higher than the upper ends of the second fin active areas 16.

Figure 8:
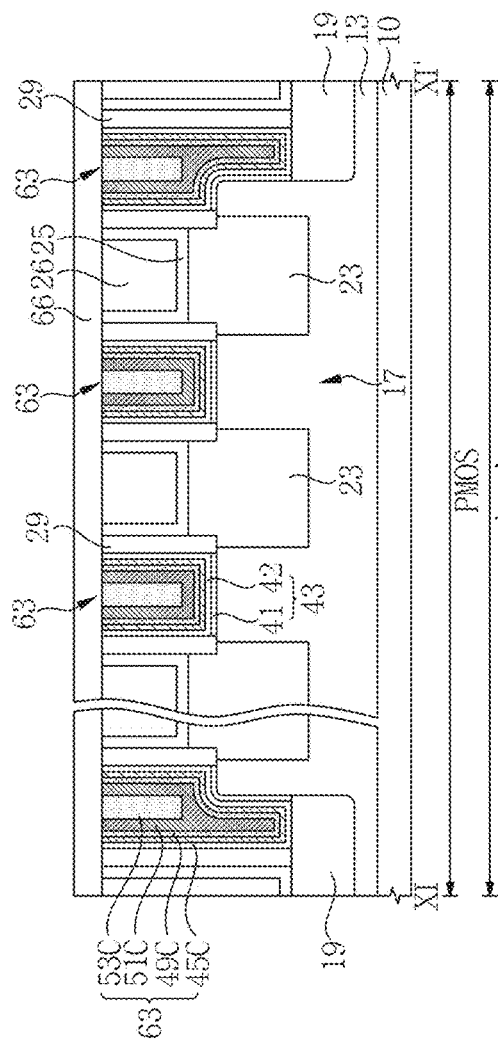
FIG. 8 is a cross-sectional view taken along line XI-XI' of FIG. 3.

FIG. 8 is a cross-sectional view taken along line XI-XI' of FIG. 3.

Referring to FIGS. 3 and 8, the third fin active areas 17 may be defined by the isolation layer 19 on the third well 13. The third gate electrodes 63 may cross the third fin active areas 17 and extend on the isolation layer 19. The third sources/drains 23 may be formed on the third fin active areas 17 between the third gate electrodes 63. Bottoms of the third sources/drains 23 may be formed at a level lower than the upper ends of the third fin active areas 17. Upper ends of the third sources/drains 23 may be formed at a level higher than the upper ends of the third fin active areas 17.

Figure 9:
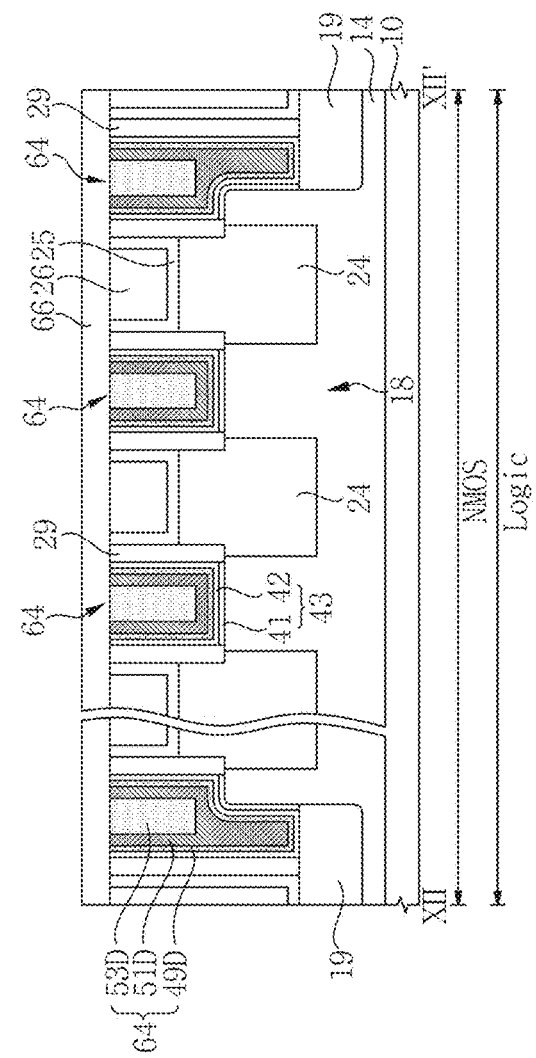
FIG. 9 is a cross-sectional view taken along line XII-XII' of FIG. 3.

FIG. 9 is a cross-sectional view taken along line XII-XII' of FIG. 3.

Referring to FIGS. 3 and 9, the fourth fin active areas 18 may be defined by the isolation layer 19 on the fourth well 14. The fourth gate electrodes 64 may cross the fourth fin active areas 18 and extend on the isolation layer 19. The fourth sources/drains 24 may be formed on the fourth fin active areas 18 between the fourth gate electrodes 64. Bottoms of the fourth sources/drains 24 may be formed at a level lower than the upper ends of the fourth fin active areas 18. Upper ends of the fourth sources/drains 24 may be formed at a level higher than the upper ends of the fourth fin active areas 18.

FIGS. 10 to 15 are cross-sectional views for describing semiconductor devices according to example embodiments of the inventive concepts.

Figure 10:
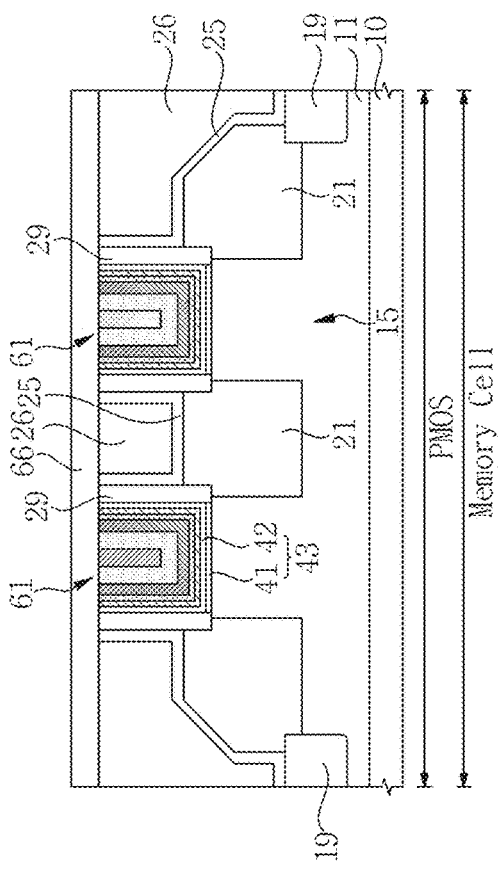
FIGS. 10 to 15 are cross-sectional views for describing semiconductor devices according to example embodiments of the inventive concepts.

Referring to FIG. 10, side surfaces of first sources/drains 21 may have an inclined profile. An etch stop layer 25 may cover the first sources/drains 21 and an isolation layer 19.

Figure 11:
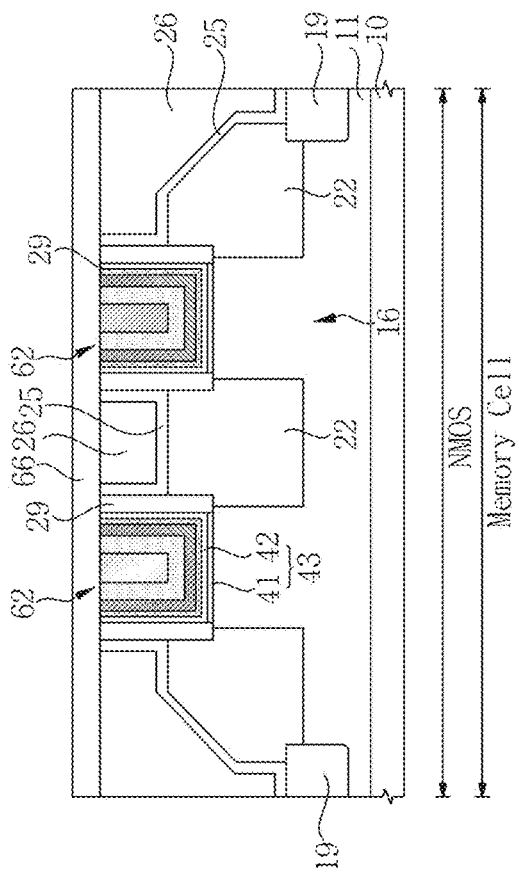

Referring to FIG. 11, side surfaces of second sources/drains 22 may have an inclined profile. The etch stop layer 25 may cover the second sources/drains 22 and the isolation layer 19.

Figure 12:
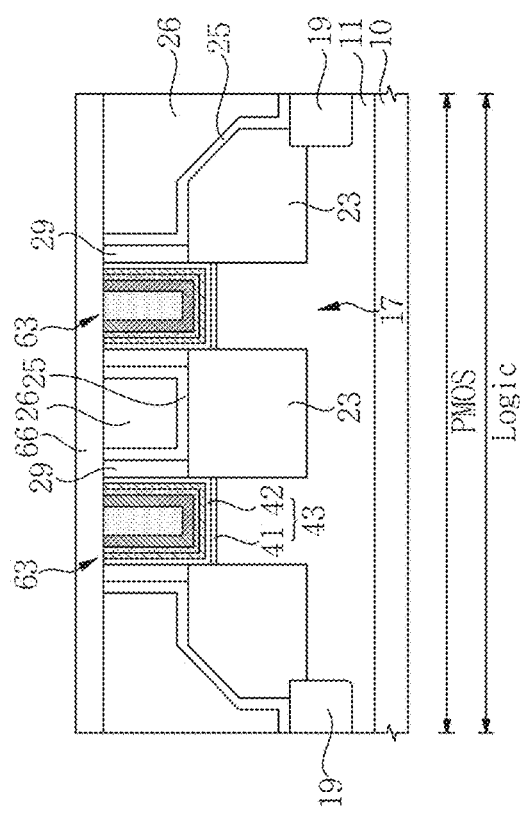

Referring to FIG. 12, side surfaces of third sources/drains 23 may have an inclined profile. The etch stop layer 25 may cover the third sources/drains 23 and the isolation layer 19.

Figure 13:
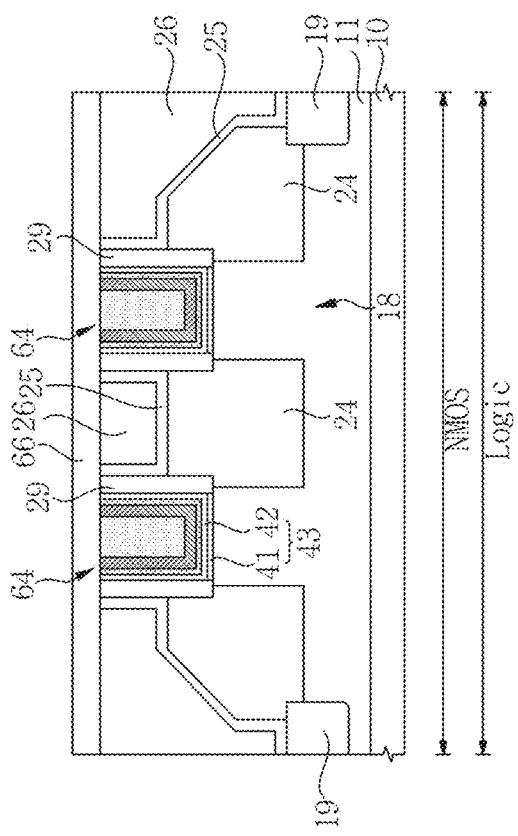

Referring to FIG. 13, side surfaces of fourth sources/drains 24 may have an inclined profile. The etch stop layer 25 may cover the fourth sources/drains 24 and the isolation layer 19.

Figure 14:
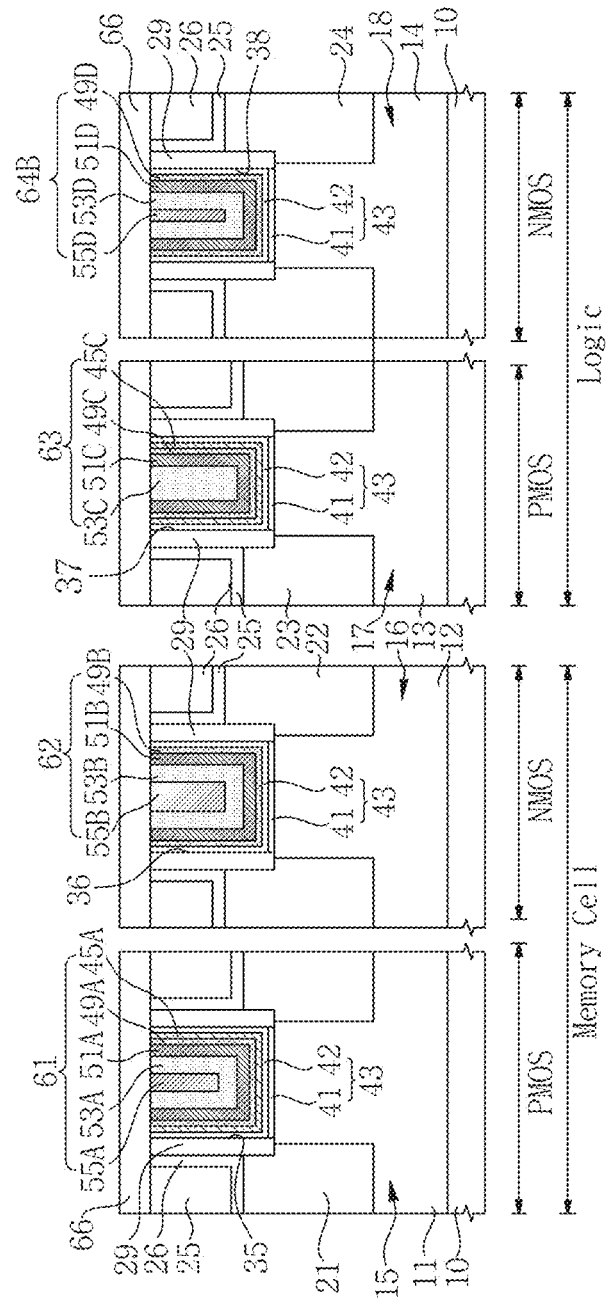

Referring to FIG. 14, a fourth gate electrode 64B may include a fourth capping layer 49D, a fourth N-work-function metal layer 51D, a fourth barrier metal layer 53D, and a third conductive layer 55D. The fourth barrier metal layer 53D may surround side surfaces and a bottom of the third conductive layer 55D. The third conductive layer 55D may completely fill a fourth trench 38. The third conductive layer 55D may include the same material simultaneously formed using the same thin film formation process as the first conductive layer 55A and the second conductive layer 55B.

Figure 15:
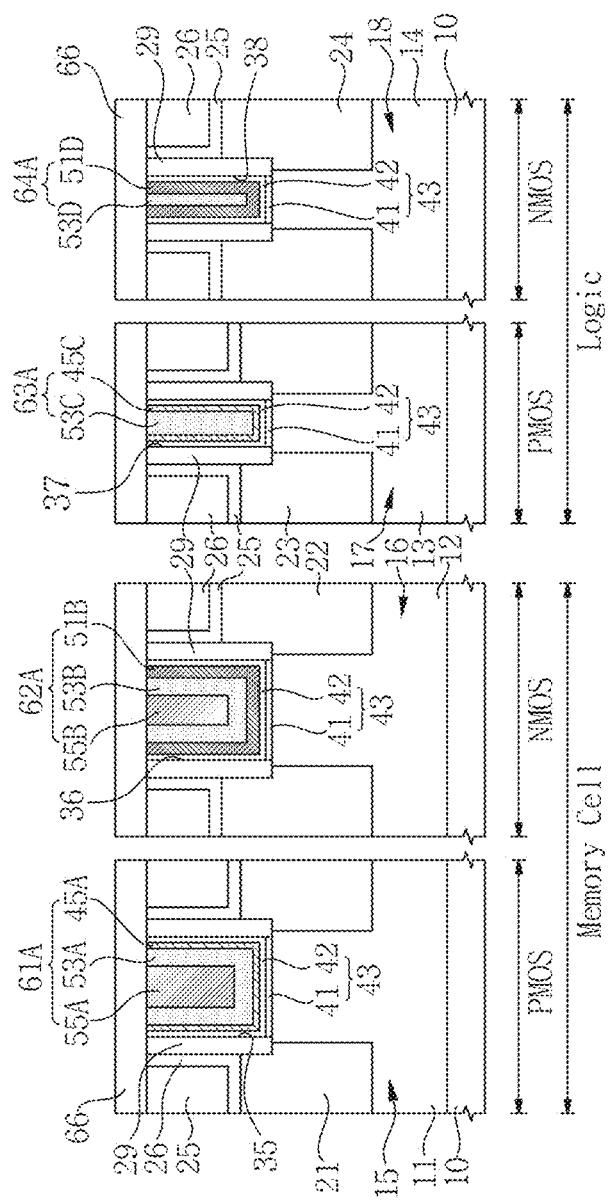

Referring to FIG. 15, a first gate electrode 61A may include a first P-work-function metal layer 45A, a first barrier metal layer 53A, and a first conductive layer 55A. A second gate electrode 62A may include a second N-work-function metal layer 51B, a second barrier metal layer 53B, and a second conductive layer 55B. A third gate electrode 63A may include a second P-work-function metal layer 45C and a third barrier metal layer 53C. A fourth gate electrode 64A may include a fourth N-work-function metal layer 51D and a fourth barrier metal layer 53D. The first P-work-function metal layer 45A, the second N-work-function metal layer 51B, the second P-work-function metal layer 45C, and the fourth N-work-function metal layer 51D may directly contact a gate dielectric layer 43.

FIGS. 16 to 27 are cross-sectional views taken along lines I-I', and IV-IV' of FIG. 3 for describing a method of forming a semiconductor device in accordance with example embodiments of the inventive concepts.

Referring to FIGS. 3 and 16, a first well 11, a second well 12, a third well 13, a fourth well 14, first fin active areas 15, second fin active areas 16, third fin active areas 17, fourth fin active areas 18, first sources/drains 21, second sources/drains 22, third sources/drains 23, fourth sources/drains 24, an etch stop layer 25, a lower insulating layer 26, spacers 29, a buffer layer 31, first sacrificial patterns 32A, second sacrificial patterns 32B, third sacrificial patterns 32C, and fourth sacrificial patterns 32D may be formed on a substrate 10. The substrate 10 may include a memory cell area and a logic area. Each of the memory cell area and the logic area may include a PMOS area and a NMOS area.

The substrate 10 may be a semiconductor substrate, e.g., a silicon wafer or a silicon on insulator (SOI) wafer. For example, the substrate 10 may be a single crystal silicon wafer having P-type impurities. The first well 11 may be formed in the PMOS area of the memory cell area on the substrate 10. For example, the first well 11 may include single crystal silicon having N-type impurities. The second well 12 may be formed in the NMOS area of the memory cell area on the substrate 10. For example, the second well 12 may include single crystal silicon having P-type impurities. The third well 13 may be formed in the PMOS area of the logic area on the substrate 10. For example, the third well 13 may include single crystal silicon having N-type impurities. The fourth well 14 may be formed in the NMOS area of the logic area on the substrate 10. For example, the fourth well 14 may include single crystal silicon having P-type impurities. In example embodiments of the inventive concepts, the second well 12 and the fourth well 14 may be omitted.

The first fin active areas 15 may be formed on the first well 11. The first fin active areas 15 may be formed in the PMOS area of the memory cell area. The first fin active areas 15 may be parallel to each other. The first fin active areas 15 may include the same material as the first well 11. For example, the first fin active areas 15 may include single crystal silicon having N-type impurities. The second fin active areas 16 may be formed on the second well 12. The second fin active areas 16 may be formed in the NMOS area of the memory cell area. The second fin active areas 16 may be parallel to each other. The second fin active areas 16 may include the same material as the second well 12. For example, the second fin active areas 16 may include single crystal silicon having the P-type impurities.

The third fin active areas 17 may be formed on the third well 13. The third fin active areas 17 may be parallel to each other. The third fin active areas 17 may be formed in the PMOS area of the logic area. The third fin active areas 17 may include the same material as the third well 13. For example, the third fin active areas 17 may include single crystal silicon having the N-type impurities. The fourth fin active areas 18 may be formed on the fourth well 14. The fourth fin active areas 18 may be formed in the NMOS area of the logic area. The fourth fin active areas 18 may be parallel to each other. The fourth fin active areas 18 may include the same material as the fourth well 14. For example, the fourth fin active areas 18 may include single crystal silicon having the P-type impurities.

Each of the first sacrificial patterns 32A may cross the first fin active areas 15. Each of the second sacrificial patterns 32B may cross the second fin active areas 16. Each of the third sacrificial patterns 32C may cross the third fin active areas 17. Each of the fourth sacrificial patterns 32D may cross the fourth fin active areas 18. The buffer layer 31 may be formed between the first sacrificial patterns 32A and the first fin active areas 15, between the second sacrificial patterns 32B and the second fin active areas 16, between the third sacrificial patterns 32C and the third fin active areas 17, and between the fourth sacrificial patterns 32D and the fourth fin active areas 18. The spacers 29 may be formed on side surfaces of the first sacrificial patterns 32A, the second sacrificial patterns 32B, the third sacrificial patterns 32C, and the fourth sacrificial patterns 32D.

The spacers 29 and the buffer layer 31 may include a material having an etch selectivity with respect to the first fin active areas 15, the second fin active areas 16, the third fin active areas 17, and the fourth fin active areas 18. The first sacrificial patterns 32A, the second sacrificial patterns 32B, the third sacrificial patterns 32C, and the fourth sacrificial patterns 32D may include a material having an etch selectivity with respect to the spacers 29. For example, the buffer layer 31 may include silicon oxide. The first sacrificial patterns 32A, the second sacrificial patterns 32B, the third sacrificial patterns 32C, and the fourth sacrificial patterns 32D may include polysilicon. The spacers 29 may include silicon nitride.

The first sources/drains 21 may be formed in the first fin active areas 15. The first sources/drains 21 may be aligned outside the first sacrificial patterns 32A. Upper ends of the first sources/drains 21 may protrude to a level higher than upper ends of the first fin active areas 15. The second sources/drains 22 may be formed in the second fin active areas 16. The second sources/drains 22 may be aligned outside the second sacrificial patterns 32B. Upper ends of the second sources/drains 22 may protrude to a level higher than upper ends of the second fin active areas 16. The upper ends of the second sources/drains 22 may be formed at a level higher than the upper ends of the first sources/drains 21.

The third sources/drains 23 may be formed in the third fin active areas 17. The third sources/drains 23 may be aligned outside the third sacrificial patterns 32C. Upper ends of the third sources/drains 23 may protrude to a level higher than upper ends of the third fin active areas 17. The fourth sources/drains 24 may be formed in the fourth fin active areas 18. The fourth sources/drains 24 may be aligned outside the fourth sacrificial patterns 32D. Upper ends of the fourth sources/drains 24 may protrude to a level higher than upper ends of the fourth fin active areas 18. The upper ends of the fourth sources/drains 24 may be formed at a level higher than the upper ends of the third sources/drains 23.

The first sources/drains 21, the second sources/drains 22, the third sources/drains 23, and the fourth sources/drains 24 may include a crystal growth material. For example, the first sources/drains 21 and the third sources/drains 23 may include SiGe, Si, or a combination thereof formed by a selective epitaxial growth (SEG) method. The first sources/drains 21 and the third sources/drains 23 may include P-type impurities. The second sources/drains 22 and the fourth sources/drains 24 may include SiC, Si, or a combination thereof formed by an SEG method. The second sources/drains 22 and the fourth sources/drains 24 may include N-type impurities.

The etch stop layer 25 may cover the first sources/drains 21, the second sources/drains 22, the third sources/drains 23, and the fourth sources/drains 24. The etch stop layer 25 may cover side surfaces of the spacers 29. The lower insulating layer 26 may cover the etch stop layer 25. The etch stop layer 25 may include a material having an etch selectivity with respect to the lower insulating layer 26. For example, the lower insulating layer 26 may include silicon oxide and the etch stop layer 25 may include silicon nitride.

Upper ends of the lower insulating layer 26, the etch stop layer 25, the spacers 29, the first sacrificial patterns 32A, the second sacrificial patterns 32B, the third sacrificial patterns 32C, and the fourth sacrificial patterns 32D may be exposed on substantially the same plane.

In example embodiments of the inventive concepts, the buffer layer 31 may be omitted. In example embodiments of the inventive concepts, the first sacrificial patterns 32A, the second sacrificial patterns 32B, the third sacrificial patterns 32C, and the fourth sacrificial patterns 32D may include a plurality of different material layers. The first sacrificial patterns 32A, the second sacrificial patterns 32B, the third sacrificial patterns 32C, and the fourth sacrificial patterns 32D may each include a TiN layer and an amorphous silicon layer formed on the TiN layer.

Referring to FIGS. 3 and 17, first trenches 35, second trenches 36, third trenches 37, and fourth trenches 38 may be formed by removing the first sacrificial patterns 32A, the second sacrificial patterns 32B, the third sacrificial patterns 32C, the fourth sacrificial patterns 32D, and the buffer layer 31. Each of the first trenches 35 may have a first width L1. Each of the second trenches 36 may have a second width L2. Each of the third trenches 37 may have a third width L3. Each of the fourth trenches 38 may have a fourth width L4. The third width L3 may be smaller than the first width L1 and the second width L2. The fourth width L4 may be smaller than the first width L1 and the second width L2. The second width L2 may be substantially the same as the first width L1. The fourth width L4 may be substantially the same as the third width L3.

The first fin active areas 15 and the spacers 29 may be exposed in the first trenches 35. The second fin active areas 16 and the spacers 29 may be exposed in the second trenches 36. The third fin active areas 17 and the spacers 29 may be exposed in the third trenches 37. The fourth fin active areas 18 and the spacers 29 may be exposed in the fourth trenches 38. Each of the first trenches 35 may cross the first fin active areas 15. Each of the second trenches 36 may cross the second fin active areas 16. Each of the third trenches 37 may cross the third fin active areas 17. Each of the fourth trenches 38 may cross the fourth fin active areas 18.

Referring to FIGS. 3 and 18, a gate dielectric layer 43 may be formed. The gate dielectric layer 43 may include a lower gate dielectric layer 41 and an upper gate dielectric layer 42.

The lower gate dielectric layer 41 may include a chemical oxide formed by a cleaning process. The lower gate dielectric layer 41 may include silicon oxide formed by a reaction of $H_2O_2$ and Si. The lower gate dielectric layer 41 may be referred to as an interfacial oxide. The upper gate dielectric layer 42 may include a high-k dielectric. The upper gate dielectric layer 42 may include HfO, HfSiO, or a combination thereof.

The lower gate dielectric layer 41 may directly contact the first fin active areas 15, the second fin active areas 16, the third fin active areas 17, and the fourth fin active areas 18. The upper gate dielectric layer 42 may be formed on the lower gate dielectric layer 41. The upper gate dielectric layer 42 may conformally cover inner walls of the first trenches 35, the second trenches 36, the third trenches 37, and the fourth trenches 38. The upper gate dielectric layer 42 may cover the lower insulating layer 26 and the etch stop layer 25.

In example embodiments of the inventive concepts, the gate dielectric layer 43 may be formed before the first sacrificial patterns 32A, the second sacrificial patterns 32B, the third sacrificial patterns 32C, the fourth sacrificial patterns 32D, and the buffer layer 31 are formed. Upper ends of the lower insulating layer 26, the etch stop layer 25, the spacers 29, and the gate dielectric layer 43 may be exposed on substantially the same plane.

In example embodiments of the inventive concepts, the gate dielectric layer 43 may include different layers between the upper gate dielectric layer 42 and the lower gate dielectric layer 41, or between the lower gate dielectric layer 41 and the first to fourth fin active areas 15, 16, 17, and 18. For example, the gate dielectric layer 43 may include a LaO layer between the upper gate dielectric layer 42 and the lower gate dielectric layer 41, or between the lower gate dielectric layer 41 and the first to fourth fin active areas 15, 16, 17, and 18.

Referring to FIGS. 3 and 19, a P-work-function metal layer 45 may be formed. The P-work-function metal layer 45 may have a first thickness d1. The P-work-function metal layer 45 may directly contact the gate dielectric layer 43. The P-work-function metal layer 45 may conformally cover the inner walls of the first trenches 35, the second trenches 36, the third trenches 37, and the fourth trenches 38. For example, the P-work-function metal layer 45 may include a TiN layer having a thickness in a range of 1 nm to 2 nm. The gate dielectric layer 43 may contact side surfaces and a bottom of the P-work-function metal layer 45.

Figure 20:
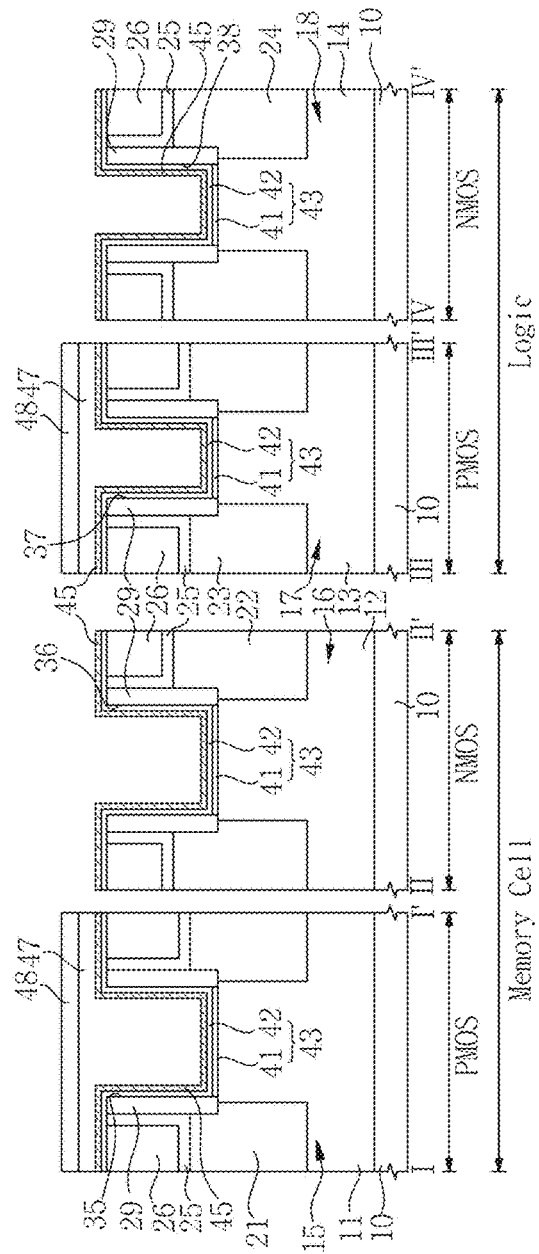

Referring to FIGS. 3 and 20, a first mask pattern 47 and a second mask pattern 48 may be formed. The second mask pattern 48 may cover the first mask pattern 47. For example, the second mask pattern 48 may include a photoresist and the first mask pattern 47 may include a bottom anti-reflective coating (BARC) layer.

The PMOS area of the memory cell area and the PMOS area of the logic area may be covered by the first mask pattern 47 and the second mask pattern 48, and the NMOS area of the memory cell area and the NMOS area of the logic area may be exposed. The P-work-function metal layer 45 formed in the NMOS area of the memory cell area and the NMOS area of the logic area may be exposed. The P-work-function metal layer 45 formed in the second trenches 36 and the fourth trenches 38 may be exposed.

Figure 21:
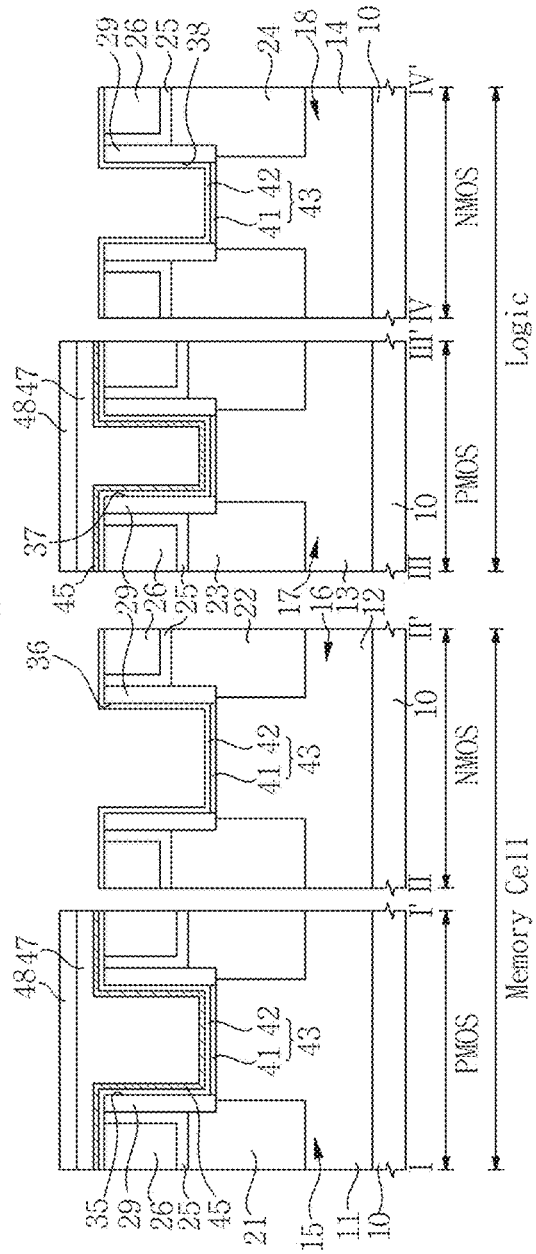

Referring to FIGS. 3 and 21, the P-work-function metal layer 45 in the NMOS area may be removed. The gate dielectric layer 43 may be exposed in the second trenches 36 and the fourth trenches 38. The P-work-function metal layer 45 may remain in the first trenches 35 and the third trenches 37.

Referring to FIGS. 3 and 22, the first mask pattern 47 and the second mask pattern 48 may be removed. The P-work-function metal layer 45 may be exposed in the first trenches 35 and the third trenches 37.

Referring to FIGS. 3 and 23, a capping layer 49 may be formed. The capping layer 49 may have a second thickness d2. For example, the capping layer 49 may include a TiN layer having a thickness in a range of 1 nm to 2 nm. The capping layer 49 may conformally cover the inner walls of the first trenches 35, the second trenches 36, the third trenches 37, and the fourth trenches 38. The capping layer 49 may directly contact the P-work-function metal layer 45 included in the first trenches 35 and the third trenches 37. The capping layer 49 may directly contact the gate dielectric layer 43 included in the second trenches 36 and the fourth trenches 38.

Referring to FIGS. 3 and 24, an N-work-function metal layer 51 may be formed on the capping layer 49. The N-work-function metal layer 51 may have a third thickness d3. The third thickness d3 may be greater than the first thickness d1. The third thickness d3 may be greater than the second thickness d2. The N-work-function metal layer 51 may include TiAlC, TiAl, or a combination thereof. For example, the N-work-function metal layer 51 may include a TiAlC layer having a thickness in a range of 3 nm to 5 nm.

The N-work-function metal layer 51 may conformally cover the inner walls of the first trenches 35, the second trenches 36, the third trenches 37, and the fourth trenches 38. The N-work-function metal layer 51 may directly contact the capping layer 49.

Referring to FIGS. 3 and 25, a barrier metal layer 53 may be formed on the N-work-function metal layer 51. The barrier metal layer 53 may have a fourth thickness d4. The fourth thickness d4 may be greater than the third thickness d3. For example, the barrier metal layer 53 may include a TiN layer having a thickness in a range of 5 nm to 7 nm. The barrier metal layer 53 may directly contact the N-work-function metal layer 51. The barrier metal layer 53 may conformally cover the inner walls of the first trenches 35 and the second trenches 36. The barrier metal layer 53 may completely fill insides of the third trenches 37 and the fourth trenches 38.

Figure 26:
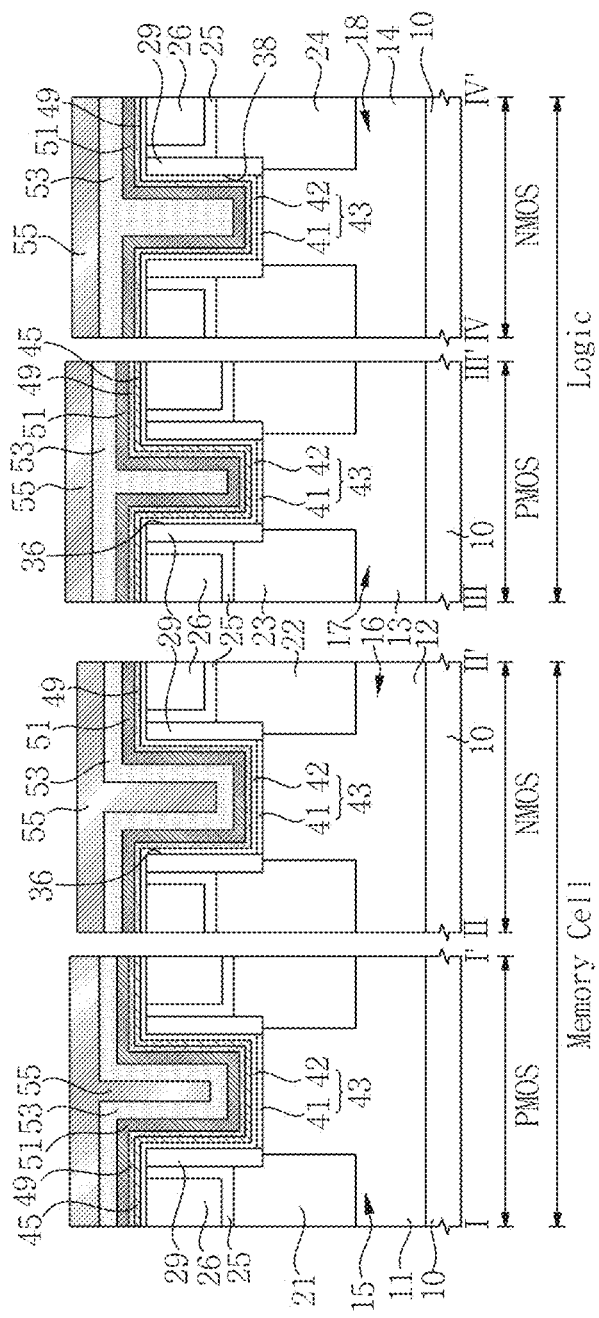

Referring to FIGS. 3 and 26, a conductive layer 55 may be formed on the barrier metal layer 53. The conductive layer 55 may include W, Al, or a combination thereof. The conductive layer 55 may completely fill insides of the first trenches 35 and the second trenches 36.

Figure 27:
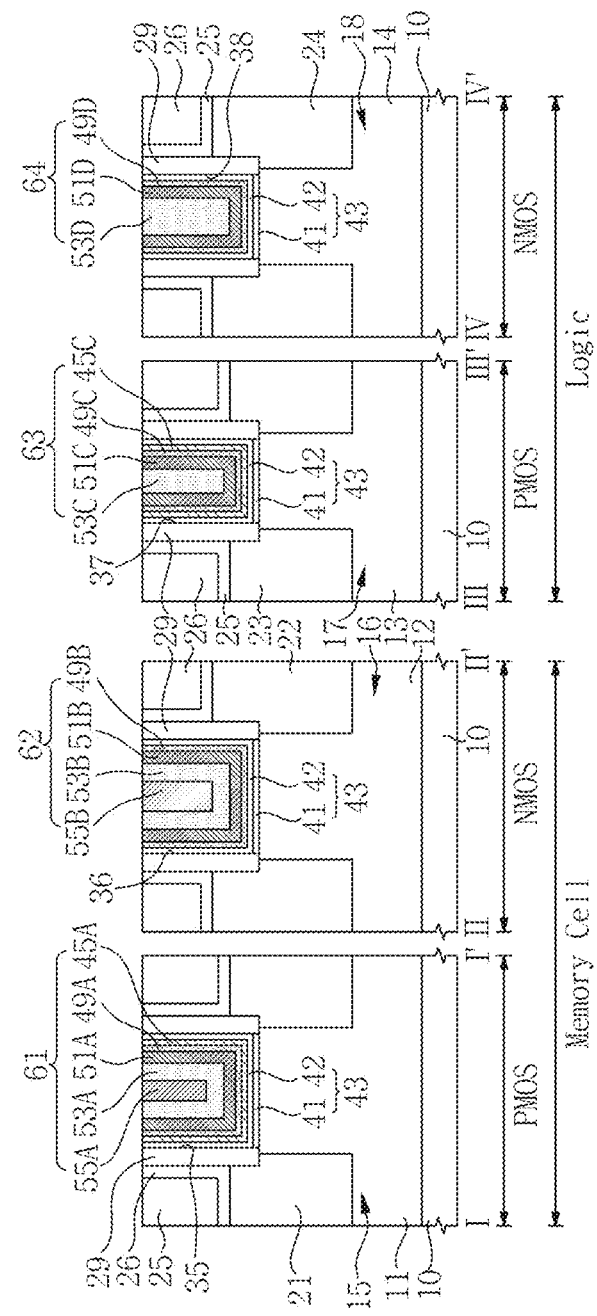

Referring to FIGS. 3 and 27, a first P-work-function metal layer 45A, a second P-work-function metal layer 45C, a first capping layer 49A, a second capping layer 49B, a third capping layer 49C, a fourth capping layer 49D, a first N-work-function metal layer 51A, a second N-work-function metal layer 51B, a third N-work-function metal layer 51C, a fourth N-work-function metal layer 51D, a first barrier metal layer 53A, a second barrier metal layer 53B, a third barrier metal layer 53C, a fourth barrier metal layer 53D, a first conductive layer 55A, and a second conductive layer 55B may be formed by planarizing the conductive layer 55, the barrier metal layer 53, the N-work-function metal layer 51, the capping layer 49, and the P-work-function metal layer 45. The gate dielectric layer 43 may remain in the first trenches 35, the second trenches 36, the third trenches 37, and the fourth trenches 38.

The first P-work-function metal layer 45A, the first capping layer 49A, the first N-work-function metal layer 51A, the first barrier metal layer 53A, and the first conductive layer 55A may configure a first gate electrode 61. The second capping layer 49B, the second N-work-function metal layer 51B, the second barrier metal layer 53B, and the second conductive layer 55B may configure a second gate electrode 62. The second P-work-function metal layer 45C, the third capping layer 49C, the third N-work-function metal layer 51C, and the third barrier metal layer 53C may configure a third gate electrode 63. The fourth capping layer 49D, the fourth N-work-function metal layer 51D, and the fourth barrier metal layer 53D may configure a fourth gate electrode 64.

The upper ends of the lower insulating layer 26, the etch stop layer 25, the spacers 29, the gate dielectric layer 43, the first gate electrode 61, the second gate electrode 62, the third gate electrode 63, and the fourth gate electrode 64 may be exposed on substantially the same plane.

FIGS. 28 and 29 are system block diagrams of electronic devices according to example embodiments of the inventive concepts.

Referring to FIG. 28, the semiconductor devices similar to those described with reference to FIGS. 1 to 27 may be applied to an electronic system 2100. The electronic system 2100 may include a body 2110, a microprocessor 2120, a power supply 2130, a function unit 2140, and a display controller 2150. The body 2110 may be a mother board formed by a printed circuit board (PCB). The microprocessor unit 2120, the power supply 2130, the function unit 2140, and the display controller 2150 may be mounted on the body 2110. A display 2160 may be disposed inside the body 2110 or outside the body 2110. For example, the display 2160 may be disposed on a surface of the body 2110, and then may display an image processed by the display controller 2150.

The power supply 2130 may receive a constant voltage from an external power supply, divide the voltage into various voltages levels, and supply those voltages to the microprocessor 2120, the function unit 2140 and/or the display controller 2150. The microprocessor unit 2120 may receive a voltage from the power supply 2130 to control the function unit 2140 and the display 2160. The function unit 2140 may perform various functions of the electronic system 2100. For example, when the electronic system 2100 is a smart phone, the function unit 2140 may include various components which perform mobile phone functions, e.g., dialing, outputting an image to the display 2160, or outputting a voice to a speaker through communication with an external apparatus 2170, and when a camera is included, the function unit 2140 may serve as a camera image processor.

In example embodiments of the inventive concepts, when the electronic system 2100 is connected to a memory card to expand the capacity thereof, the function unit 2140 may be a memory card controller. The function unit 2140 may exchange signals with the external apparatus 2170 through a wired or wireless communication unit 2180. Furthermore, when the electronic system 2100 requires a Universal Serial Bus (USB) to expand the functions thereof, the function unit 2140 may serve as an interface controller. In addition, the function unit 2140 may include a mass storage device.

The semiconductor devices similar to those described with reference to FIGS. 1 to 27 may be applied to the function unit 2140 or the microprocessor 2120.

Referring to FIG. 29, an electronic system 2400 may include at least one of the semiconductor devices in accordance with various example embodiments of the inventive concepts. The electronic system 2400 may be applied to a mobile device or a computer. For example, the electronic system 2400 may include a memory system 2412, a microprocessor 2414, a RAM 2416, a bus 2420, and a user interface 2418. The microprocessor 2414, the memory system 2412, and the user interface 2418 may be connected to each other through the bus 2420. The user interface 2418 may be used to input data to the electronic system 2400, or output data from the electronic system 2400. The microprocessor 2414 may program and control the electronic system 2400. The RAM 2416 may be used as an operational memory of the microprocessor 2414. The microprocessor 2414, the RAM 2416, and/or other components may be assembled within a single package. The memory system 2412 may store operational codes of the microprocessor 2414, data processed by the microprocessor 2414, or data received from the outside. The memory system 2412 may include a controller and a memory.

The semiconductor devices similar to those described with reference to FIGS. 1 to 27 may be applied to the microprocessor 2414, the RAM 2416, or the memory system 2412.

According to example embodiments of the inventive concepts, first and the second trenches having a relatively large width are formed in a memory cell area, and third and fourth trenches having a relatively small width are formed in a logic area. First and the second gate electrodes are formed in the first and the second trenches to have a work-function metal layer, a barrier layer, and a conductive layer which are sequentially stacked. Third and fourth gate electrodes are formed in the third and fourth trenches to have a work-function metal layer and a barrier layer which are sequentially stacked. The first and the second gate electrodes can be advantageous to realize a uniform electrical characteristic of transistors. The third and the fourth gate electrodes can be advantageous to realize high current driving capability of the transistors. While simplifying a process, a semiconductor device having an improved electrical characteristic can be implemented.

Although a few example embodiments have been described with reference to the accompanying drawings, those skilled in the art will readily appreciate that many modifications are possible in example embodiments without departing from the scope of the inventive concepts and without changing essential features. Therefore, the above-described example embodiments should be considered in a descriptive sense only and not for purposes of limitation.

What is claimed is:

1. A semiconductor device comprising:
    a substrate having a first area and a second area;
    a first fin active area and a second fin active area in the first area on the substrate;
    a third fin active area and a fourth fin active area in the second area on the substrate;
    a first gate electrode crossing the first fin active area, the first gate electrode including,
        a first layer on the first fin active area and including Ti and N,
        a second layer on the first layer and including Ti and N,
        a third layer on the second layer and including Ti, Al and C,
        a fourth layer on the third layer and including Ti and N, and
        a fifth layer on the fourth layer and including W,
    a second gate electrode crossing the second fin active area, the second gate electrode including, a sixth layer on the second fin active area and including Ti and N,
a seventh layer on the sixth layer and including Ti, Al and C,
a eighth layer on the seventh layer and including Ti and N, and
a ninth layer on the eighth layer and including W,
a third gate electrode crossing the third fin active area, the third gate electrode including,
a tenth layer on the third fin active area and including Ti and N,
a eleventh layer on the tenth layer and including Ti, and N,
a twelfth layer on the eleventh layer and including Ti, Al and C, and
a thirteenth layer on the twelfth layer and including Ti and N, and
a fourth gate electrode crossing the fourth fin active area, the fourth gate electrode including,
a fourteenth layer on the fourth fin active area and including Ti and N,
a fifteenth layer on the fourteenth layer and including Ti, Al and C,
a sixteenth layer on the fifteenth layer and including Ti and N, and
a seventeenth layer on the sixteenth layer and including W,
wherein a width of the ninth layer is greater than a width of the seventeenth layer, and
wherein a thickness of the fourth layer is greater than a thickness of the first layer.

2. The semiconductor device of claim 1, wherein a thickness of the eighth layer is greater than a thickness of the sixth layer.

3. The semiconductor device of claim 1, wherein a thickness of the twelfth layer is greater than a thickness of the tenth layer.

4. The semiconductor device of claim 1, wherein a thickness of the twelfth layer is greater than a thickness of the eleventh layer.

5. The semiconductor device of claim 1, wherein a thickness of the fifteenth layer is greater than a thickness of the fourteenth layer.

6. The semiconductor device of claim 1, wherein a PMOS area includes the first fin active area and the first gate electrode, and
wherein a NMOS area includes the second fin active area, and the second gate electrode.

7. The semiconductor device of claim 1, wherein a PMOS area includes the third fin active area and the third gate electrode, and
wherein a NMOS area includes the fourth fin active area and the fourth gate electrode.

8. A semiconductor device comprising:
a substrate having a first area and a second area;
a first fin active area and a second fin active area in the first area on the substrate;
a first gate dielectric layer on the first fin active area;
a second gate dielectric layer on the second fin active area;
a third fin active area and a fourth fin active area in the second area on the substrate;
a third gate dielectric layer on the third fin active area;
a fourth gate dielectric layer on the fourth fin active area;
a first gate electrode crossing the first fin active area, the first gate electrode including,
a first layer on the first fin active area and including Ti and N,
a second layer on the first layer and including Ti and N,
a third layer on the second layer and including Ti, Al and C,
a fourth layer on the third layer and including Ti and N, and
a fifth layer on the fourth layer and including W,
a second gate electrode crossing the second fin active area, the second gate electrode including,
a sixth layer on the second fin active area and including Ti and N,
a seventh layer on the sixth layer and including Ti, Al and C,
a eighth layer on the seventh layer and including Ti and N, and
a ninth layer on the eighth layer and including W,
a third gate electrode crossing the third fin active area, the third gate electrode including,
a tenth layer on the third fin active area and including Ti and N,
a eleventh layer on the tenth layer and including Ti, and N,
a twelfth layer on the eleventh layer and including Ti, Al and C, and
a thirteenth layer on the twelfth layer and including Ti and N, and
a fourth gate electrode crossing the fourth fin active area, the fourth gate electrode including,
a fourteenth layer on the fourth fin active area and including Ti and N,
a fifteenth layer on the fourteenth layer and including Ti, Al and C,
a sixteenth layer on the fifteenth layer and including Ti and N, and
a seventeenth layer on the sixteenth layer and including W,
wherein a lower surface of the fifth layer is at a level higher than a lower surface of the ninth layer, and
wherein a lower surface of the ninth layer and a lower surface of the seventeenth layer are at a same level.

9. A semiconductor device comprising:
a substrate having a first area and a second area;
a first fin active area and a second fin active area in the first area on the substrate;
a third fin active area and a fourth fin active area in the second area on the substrate;
a first gate electrode crossing the first fin active area, the first gate electrode including,
a first layer on the first fin active area and including Ti and N,
a second layer on the first layer and including Ti and N,
a third layer on the second layer and including Ti, Al and C,
a fourth layer on the third layer and including Ti and N, and
a fifth layer on the fourth layer and including W,
a second gate electrode crossing the second fin active area, the second gate electrode including,
a sixth layer on the second fin active area and including Ti and N,
a seventh layer on the sixth layer and including Ti, Al and C,
a eighth layer on the seventh layer and including Ti and N, and
a ninth layer on the eighth layer and including W,
a third gate electrode crossing the third fin active area, the third gate electrode including, a tenth layer on the third fin active area and including Ti and N, a eleventh layer on the tenth layer and including Ti, and N, a twelfth layer on the eleventh layer and including Ti, Al and C, and a thirteenth layer on the twelfth layer and including Ti and N, and a fourth gate electrode crossing the fourth fin active area, the fourth gate electrode including, a fourteenth layer on the fourth fin active area and including Ti and N, a fifteenth layer on the fourteenth layer and including Ti, Al and C, a sixteenth layer on the fifteenth layer and including Ti and N, and a seventeenth layer on the sixteenth layer and including W, wherein a width of the ninth layer is greater than a width of the fifth layer, wherein a thickness of the third layer is greater than a thickness of the first layer, and wherein a thickness of the third layer is greater than a thickness of the second layer.

10. The semiconductor device of claim 9, wherein a thickness of the eighth layer is greater than a thickness of the sixth layer.

11. The semiconductor device of claim 9, wherein a thickness of the twelfth layer is greater than a thickness of the tenth layer, and wherein the thickness of the twelfth layer is greater than a thickness of the eleventh layer.

12. The semiconductor device of claim 9, wherein a thickness of the fifteenth layer is greater than a thickness of the fourteenth layer.

13. The semiconductor device of claim 9, wherein the first layer, the second layer, the third layer, the fourth layer, and the fifth layer comprise a first P-work-function metal layer, a first capping layer, a first N-work-function metal layer, a first barrier metal layer, and a first conductive layer, respectively.

14. The semiconductor device of claim 9, wherein the sixth layer, the seventh layer, the eighth layer, and the ninth layer comprise a second capping layer, a second N-work-function metal layer, a second barrier metal layer, and a second conductive layer, respectively.

15. The semiconductor device of claim 9, wherein the tenth layer, the eleventh layer, the twelfth layer, and the thirteen layer comprise a second P-work-function metal layer, a third capping layer, a third N-work-function metal layer, and a third barrier metal layer, respectively.

16. The semiconductor device of claim 9, wherein the fourteenth layer, the fifteenth layer, the sixteenth layer, and the seventeenth layer comprise a fourth capping layer, a fourth N-work-function metal layer, a fourth barrier metal layer, and a third conductive layer, respectively.

17. The semiconductor device of claim 8, wherein a PMOS area includes the third fin active area, the third gate dielectric layer, and the third gate electrode, and wherein a NMOS area includes the fourth fin active area, the fourth gate dielectric layer, and the fourth gate electrode.

18. The semiconductor device of claim 8, further comprising:

a gate electrode spacer on the substrate, wherein upper surfaces of the first gate dielectric layer and the first gate electrode are coplanar, and wherein upper surfaces of the second gate dielectric layer, and the gate electrode spacer are coplanar.

19. The semiconductor device of claim 8, further comprising:

a gate electrode spacer on the substrate, wherein upper surfaces of the third gate dielectric layer and the third gate electrode are coplanar, and wherein upper surfaces of the fourth gate dielectric layer, and the gate electrode spacer are coplanar.

20. The semiconductor device of claim 8, wherein a PMOS area includes the first fin active area, the first gate dielectric layer, and the first gate electrode, and wherein a NMOS area includes the second fin active area, the second gate dielectric layer, and the second gate electrode.

* * * * *